(12) United States Patent
Sonehara et al.

(10) Patent No.: US 8,927,955 B2
(45) Date of Patent: Jan. 6, 2015

(54) RESISTANCE CHANGE MEMORY

(75) Inventors: Takeshi Sonehara, Kawasaki (JP); Masaki Kondo, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 298 days.

(21) Appl. No.: 13/051,500

(22) Filed: Mar. 18, 2011

(65) Prior Publication Data
US 2011/0233501 A1 Sep. 29, 2011

(30) Foreign Application Priority Data

Mar. 24, 2010 (JP) .................................. 2010-068425
Nov. 22, 2010 (JP) .................................. 2010-260240

(51) Int. Cl.
*H01L 45/00* (2006.01)
*G11C 13/00* (2006.01)
*B82Y 10/00* (2011.01)
*G11C 13/02* (2006.01)
*H01L 27/24* (2006.01)

(52) U.S. Cl.
CPC ........ *G11C 13/0004* (2013.01); *G11C 2213/72* (2013.01); *H01L 45/04* (2013.01); *G11C 13/0009* (2013.01); *B82Y 10/00* (2013.01); *G11C 2213/71* (2013.01); *G11C 13/0007* (2013.01); *G11C 2013/0073* (2013.01); *G11C 13/025* (2013.01); *H01L 45/06* (2013.01); *H01L 45/144* (2013.01); *H01L 27/2409* (2013.01); *H01L 45/149* (2013.01); *H01L 45/146* (2013.01); *H01L 45/1675* (2013.01); *H01L 45/147* (2013.01); *H01L 27/2481* (2013.01); *G11C 13/0069* (2013.01)
USPC ........ 257/2; 257/1; 257/5; 257/208; 257/497; 257/536

(58) Field of Classification Search
CPC ........... G11C 2213/71; G11C 2213/72; H01L 27/24; H01L 45/04
USPC ...................... 257/1, 2, 5, 208, 497, 536, 537, 257/E45.011
See application file for complete search history.

(56) References Cited

U.S. PATENT DOCUMENTS 6,579,760 B1   6/2003   Lung
8,274,130 B2 *  9/2012   Mihnea et al. ................. 257/497

(Continued)

FOREIGN PATENT DOCUMENTS

JP   2007-281208   10/2007
JP   2008-098537 A   4/2008

(Continued)

OTHER PUBLICATIONS
U.S. Appl. No. 13/208,955, filed Aug. 12, 2011, Sonehara.

(Continued)

*Primary Examiner* — Matthew W Such
*Assistant Examiner* — David Spalla
(74) *Attorney, Agent, or Firm* — Oblon, Spivak, McClelland, Maier & Neustadt, L.L.P.

(57) ABSTRACT

According to one embodiment, a resistance change memory includes a first interconnect line extending in a first direction, a second interconnect line extending in a second direction intersecting with the first direction, and a cell unit which is provided at the intersection of the first interconnect line and the second interconnect line and which includes a memory element and a non-ohmic element that are connected in series. The memory element stores data in accordance with a change in a resistance state. The non-ohmic element includes a metal layer, a first semiconductor layer containing a first impurity, and a second semiconductor layer which is provided between the first semiconductor layer and the metal layer and which has an unevenly distributed layer.

16 Claims, 28 Drawing Sheets

(56) References Cited

U.S. PATENT DOCUMENTS

| | | | |
|---|---|---|---|
| 2006/0268594 A1 | 11/2006 | Toda | |
| 2007/0015330 A1 | 1/2007 | Li et al. | |
| 2010/0238704 A1* | 9/2010 | Komura et al. | 365/148 |
| 2011/0127483 A1 | 6/2011 | Sonehara | |
| 2011/0193049 A1* | 8/2011 | Iwakaji et al. | 257/4 |
| 2011/0210304 A1* | 9/2011 | Murooka et al. | 257/2 |
| 2012/0145984 A1* | 6/2012 | Rabkin et al. | 257/2 |

FOREIGN PATENT DOCUMENTS

| | | |
|---|---|---|
| WO | WO 2009/098734 A1 | 8/2009 |
| WO | WO 2009/137222 A2 | 11/2009 |

OTHER PUBLICATIONS

Office Action issued Mar. 4, 2014 in Japanese Patent Application No. 2010-260240 (with English language translation).

* cited by examiner

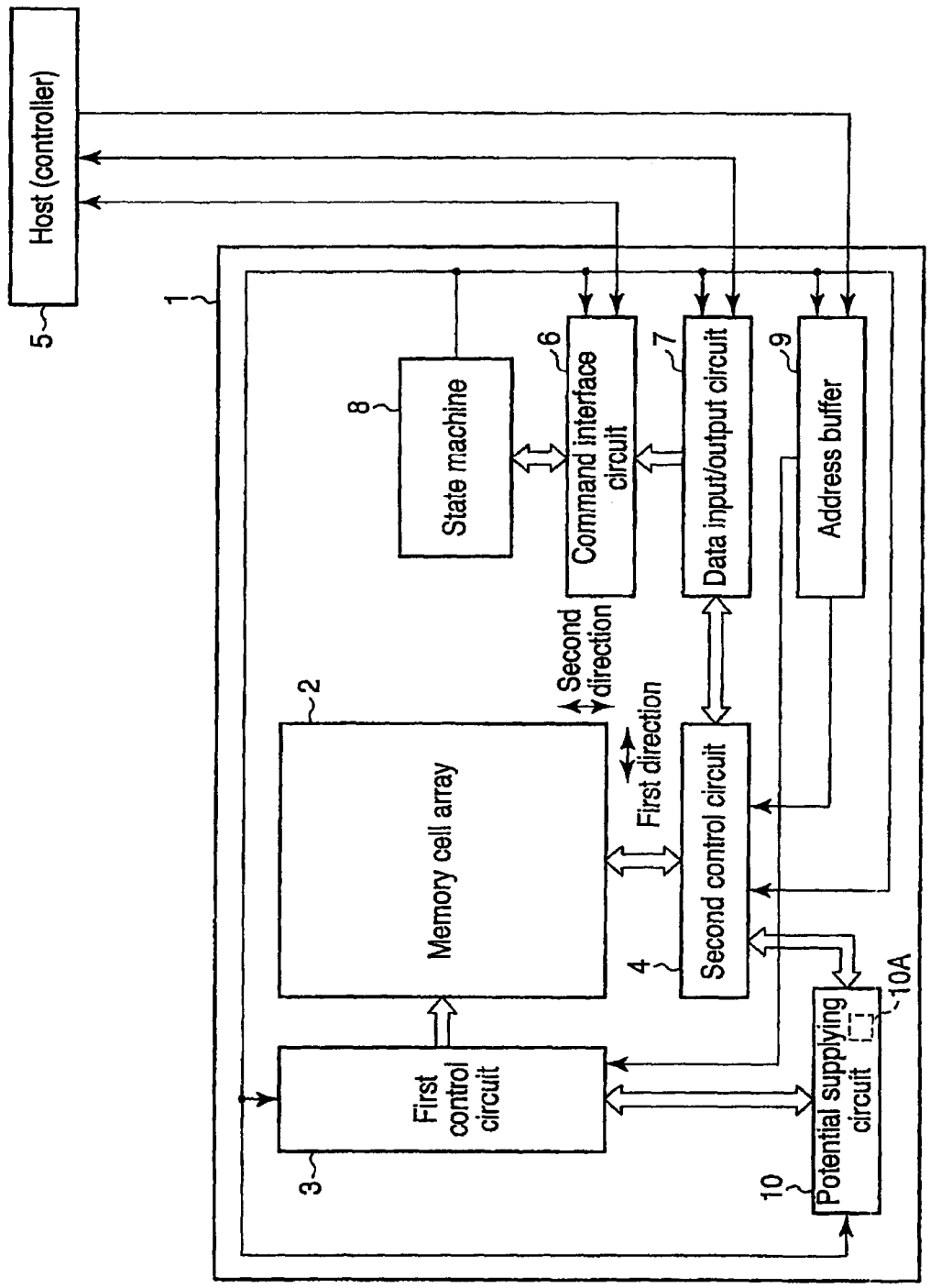
F I G. 1

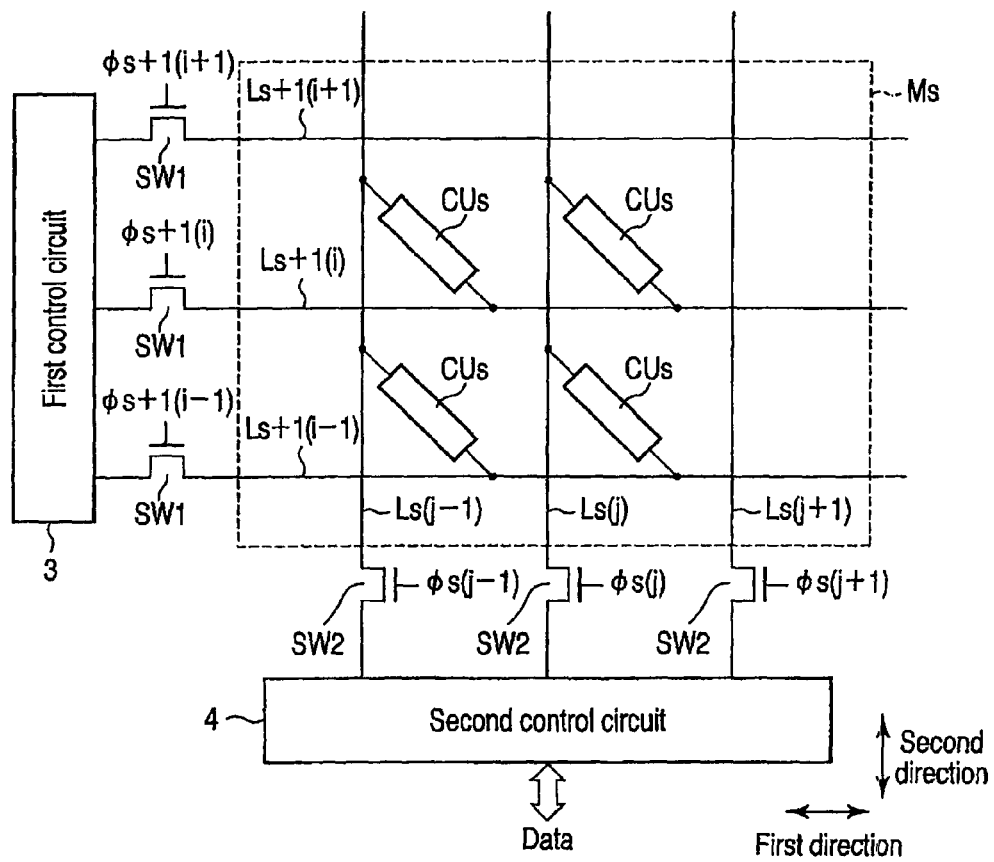
F I G. 5A

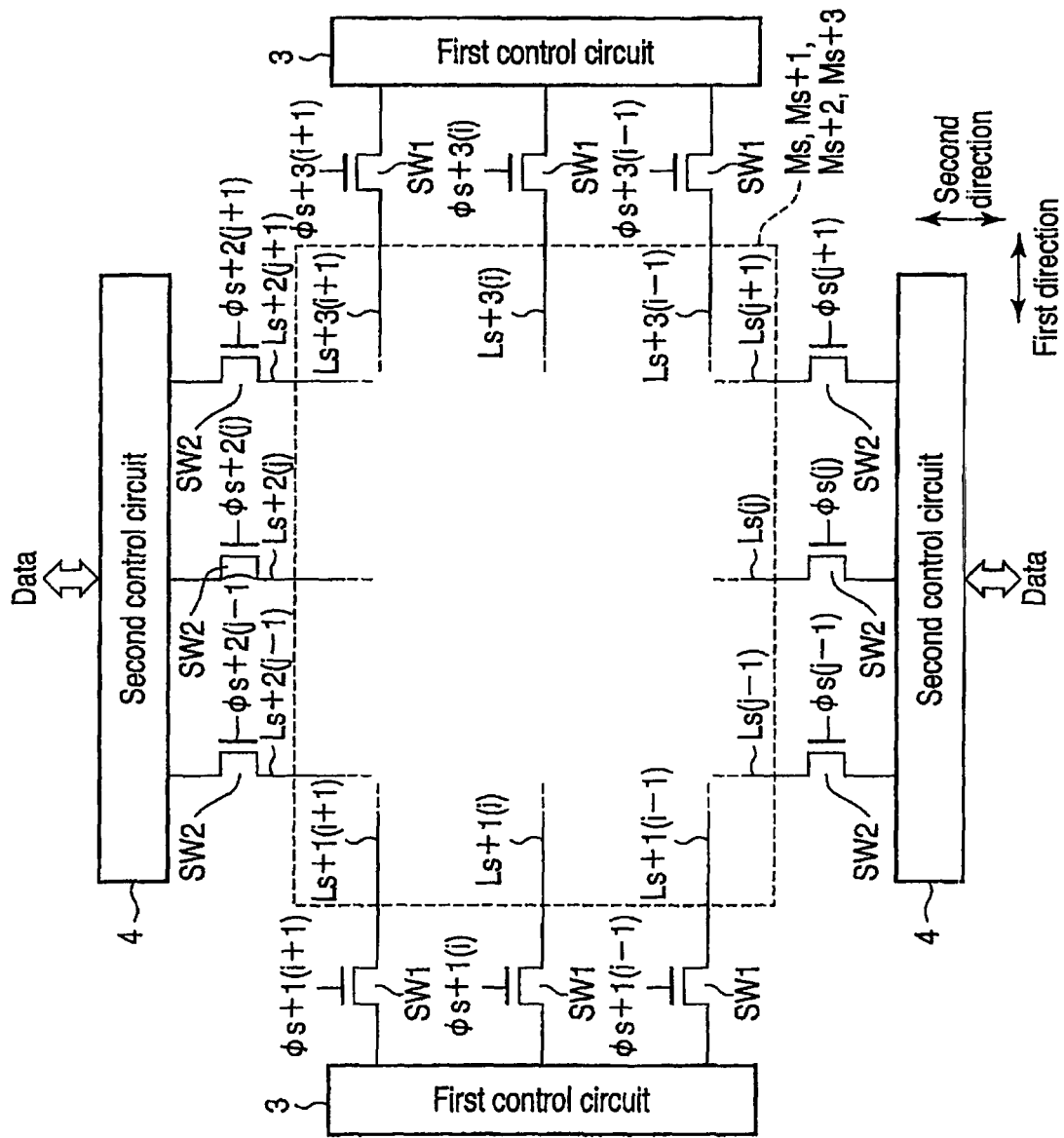
F I G. 6

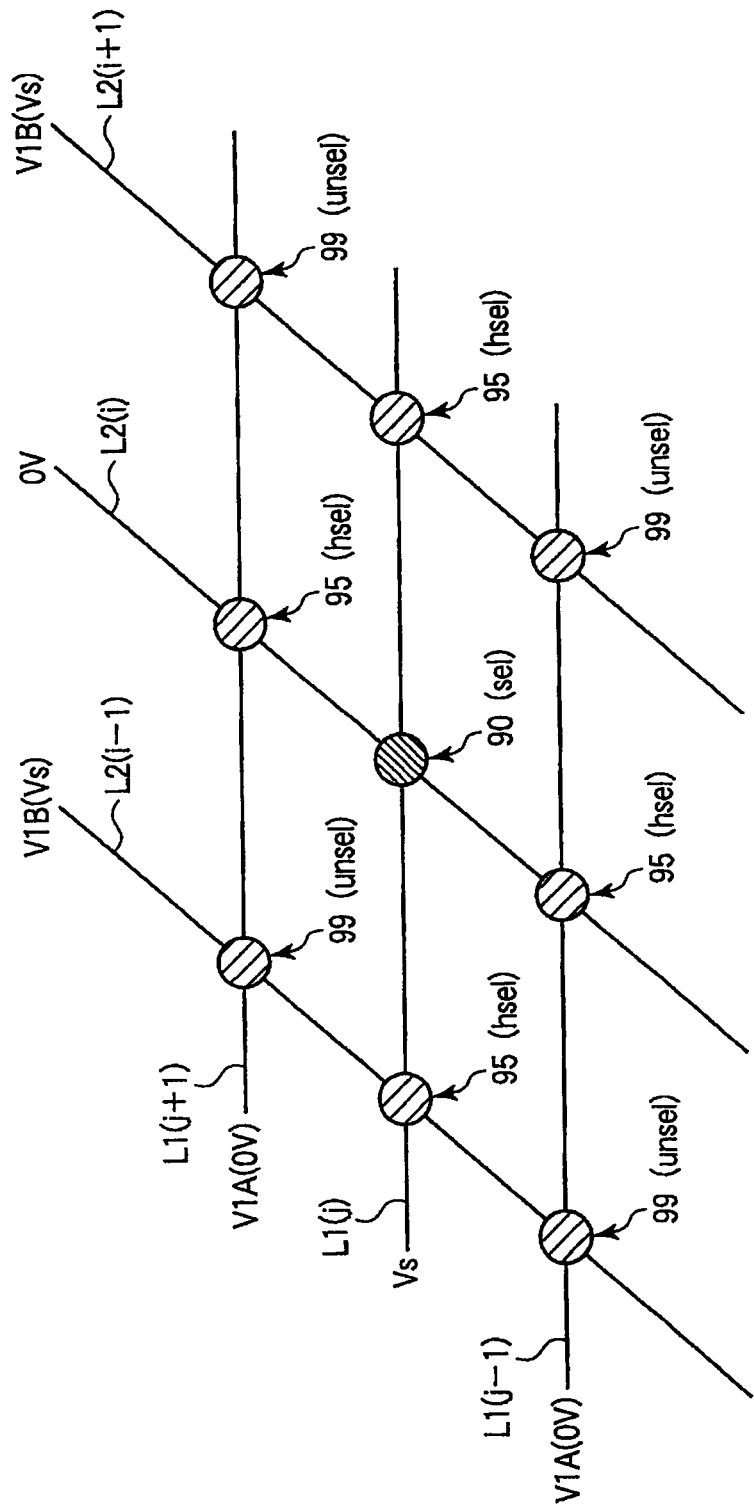
F I G. 7A

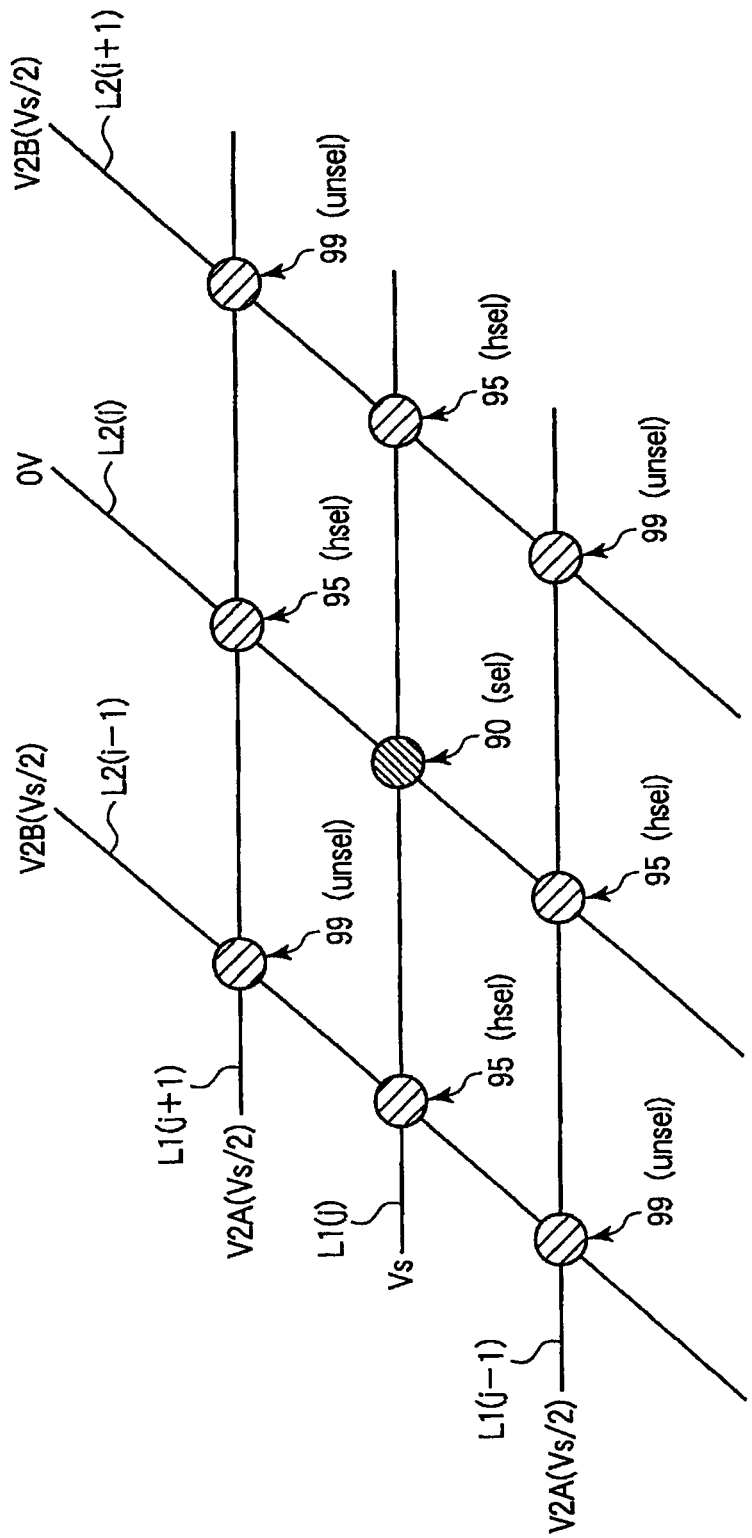
F I G. 7B

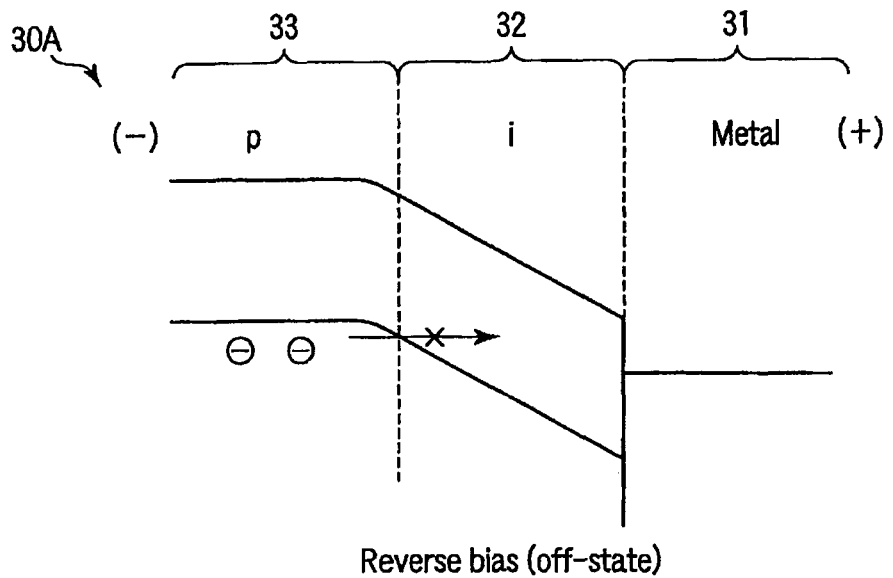
Reverse bias (off-state)
F I G. 10C
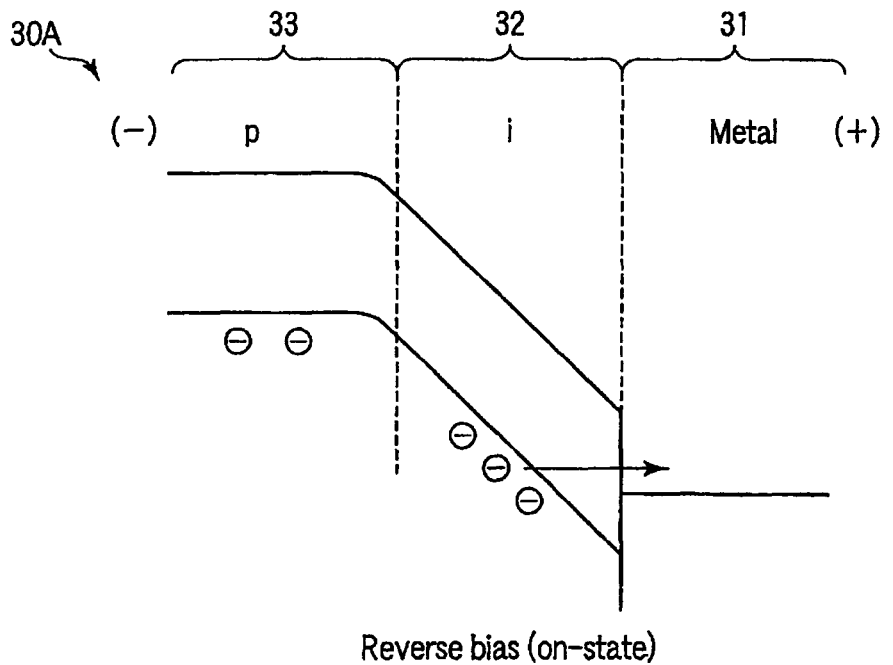
Reverse bias (on-state)
F I G. 10D

| Work function | Materials |
|---|---|
| 3.7~4.0 | $ErSi_x$, $YSi_x$, $LaB_6$ |
| 4.0~4.4 | HfSi, $HfSiN_x$, TiB, TaC, ZrC |
| 4.4~4.6 | TaC, HfB, $WSi_{2.5}$, Ta, TaB, NiSi, TaSiN |
| 4.6~4.8 | WSi, TaN, HfN, TiN, TiC |
| 4.8~5.0 | PdSi, WB, WC |
| 5.0~5.3 | $RuO_2$, PtSi, W, Ir, Ru |

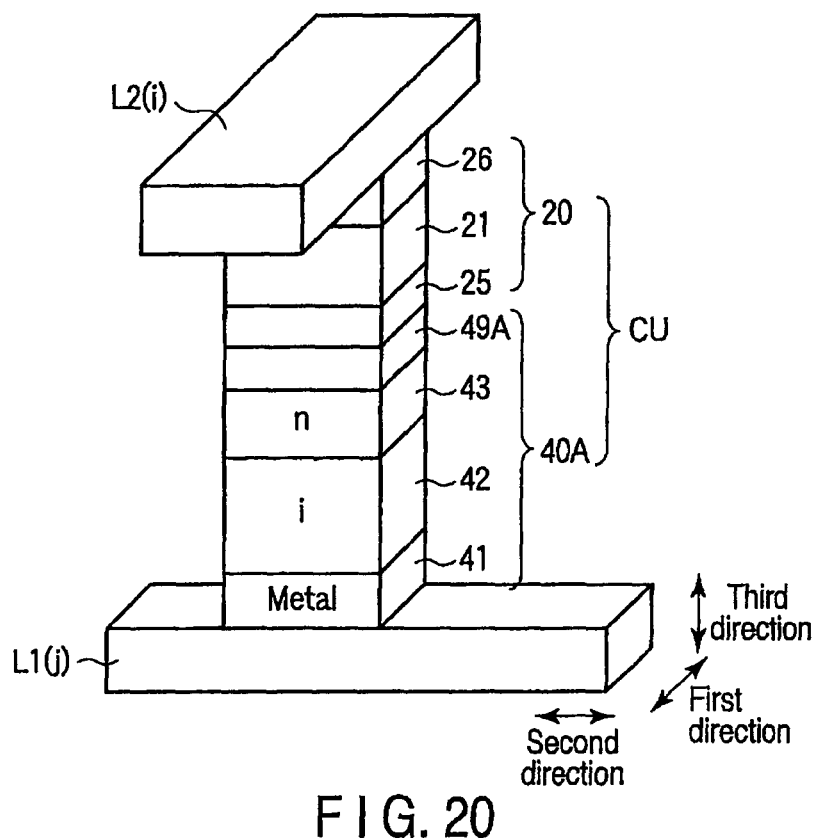
F I G. 20
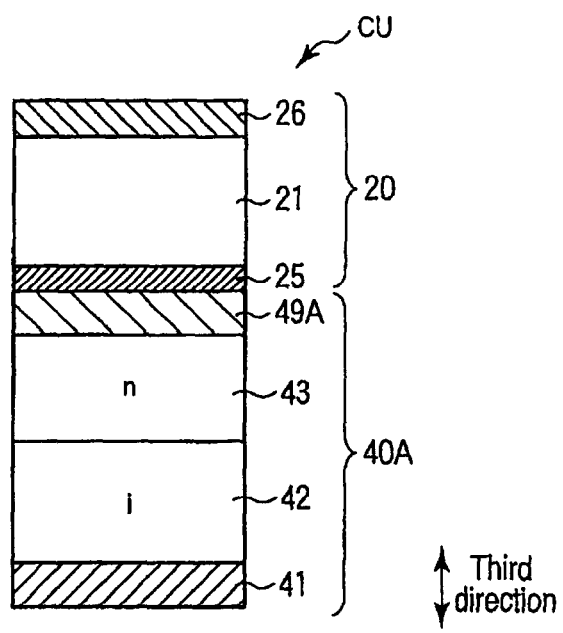
F I G. 21

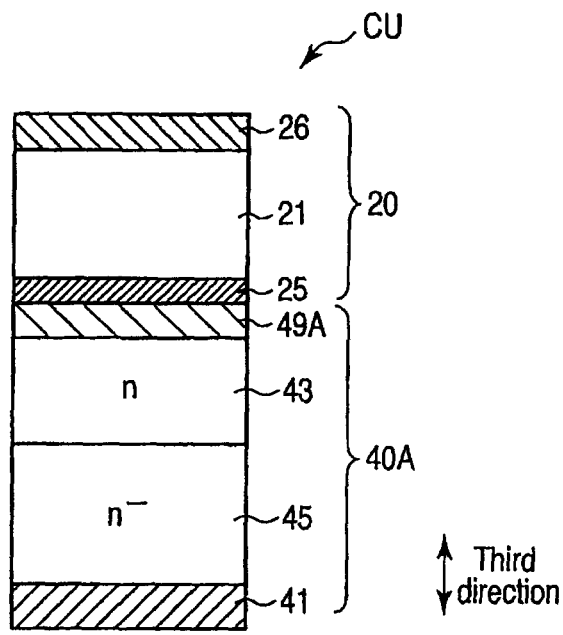
F I G. 24
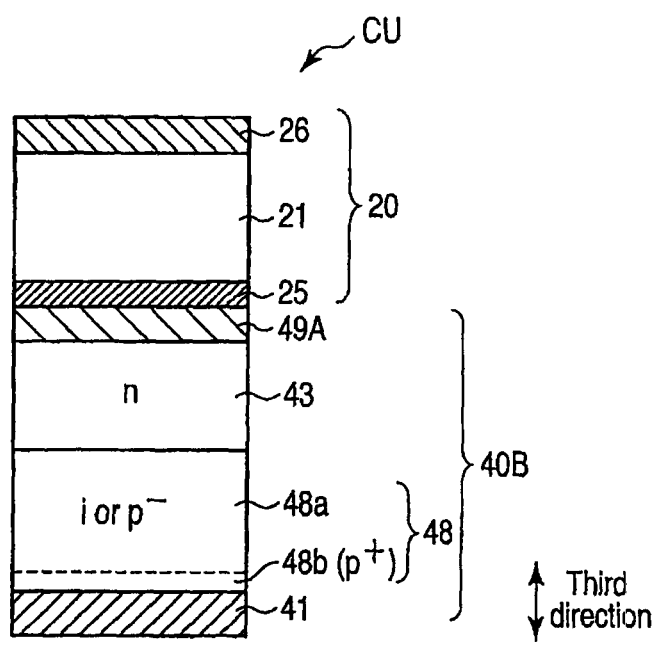
F I G. 25

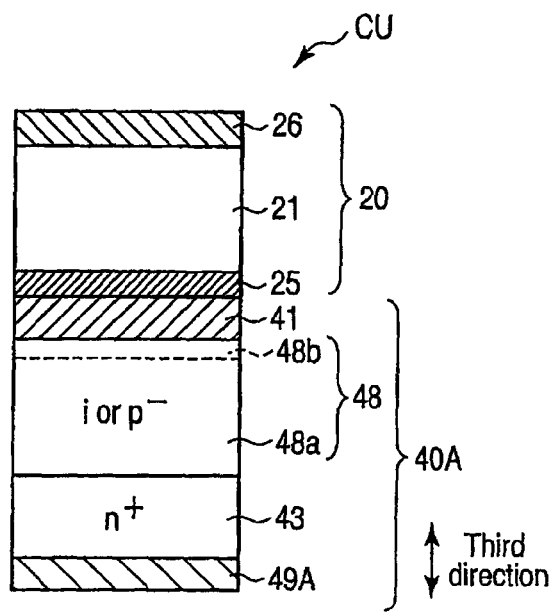
F I G. 26
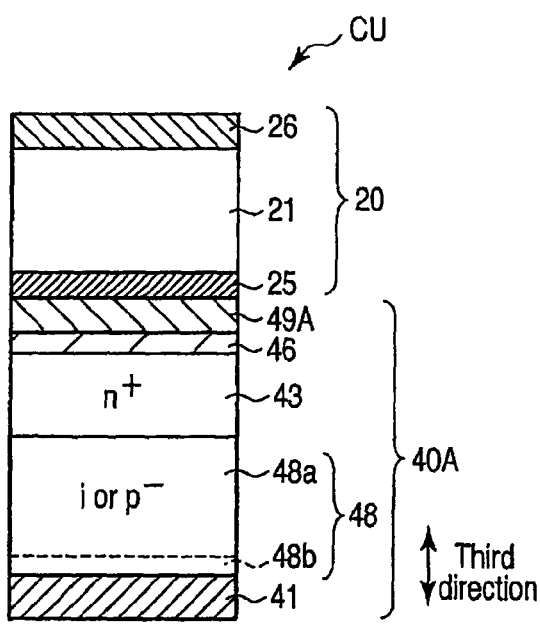
F I G. 27

RESISTANCE CHANGE MEMORY

CROSS-REFERENCE TO RELATED APPLICATIONS

This application is based upon and claims the benefit of priority from Japanese Patent Applications No. 2010-068425, filed Mar. 24, 2010; and No. 2010-260240, filed Nov. 22, 2010; the entire contents of both of which are incorporated herein by reference.

FIELD

Embodiments described herein relate generally to a resistance change memory.

BACKGROUND

Recently, as next-generation nonvolatile semiconductor memories, resistance change memories have been attracting attention, such as a resistive RAM (ReRAM) in which a variable resistive element serves as a memory element, and a phase change RAM (PCRAM) in which a phase change element serves as a memory element.

These resistance change memories are characterized in that a memory cell array is a cross-point type and a higher memory capacity is thus enabled by three-dimensional integration, and also characterized by being capable of the same high-speed operation as that of a DRAM.

Such a resistance change memory, when put into practical use, can replace, for example, a NAND flash memory as a file memory and a DRAM as a work memory.

For example, in a cross-point type memory cell array, a memory element and a rectification element are connected in series between a word line and a bit line (e.g., see Jpn. Pat. Appln. KOKAI Publication No. 2007-281208).

If the thickness of components of the rectification element is greater, the aspect ratio of a gap made after the rectification element is processed is higher, which is disadvantageous when a memory cell array is configured into a three-dimensional form.

BRIEF DESCRIPTION OF THE DRAWINGS

FIG. 1 is a diagram showing an example of the configuration of a resistance change memory;
FIG. 5A is a diagram showing the layout of first and second control circuits;
FIG. 6 is a diagram showing the layout of the first and second control circuits;
FIG. 7A is a diagram illustrating the operation of the resistance change memory;
FIG. 7B is a diagram illustrating the operation of the resistance change memory;
FIG. 10C is a graph illustrating the operation principle of the non-ohmic element;
FIG. 10D is a graph illustrating the operation principle of the non-ohmic element;
FIG. 20 is a diagram showing a basic example of a cell unit of a resistance change memory according to a second embodiment;
FIG. 21 is a diagram showing the basic example of the cell unit of the resistance change memory according to the second embodiment;
FIG. 24 is a diagram showing the example of the cell unit;
FIG. 25 is a diagram showing the example of the cell unit;
FIG. 26 is a diagram showing the example of the cell unit;
and
FIG. 27 is a diagram showing the example of the cell unit.

DETAILED DESCRIPTION

Figure 2:
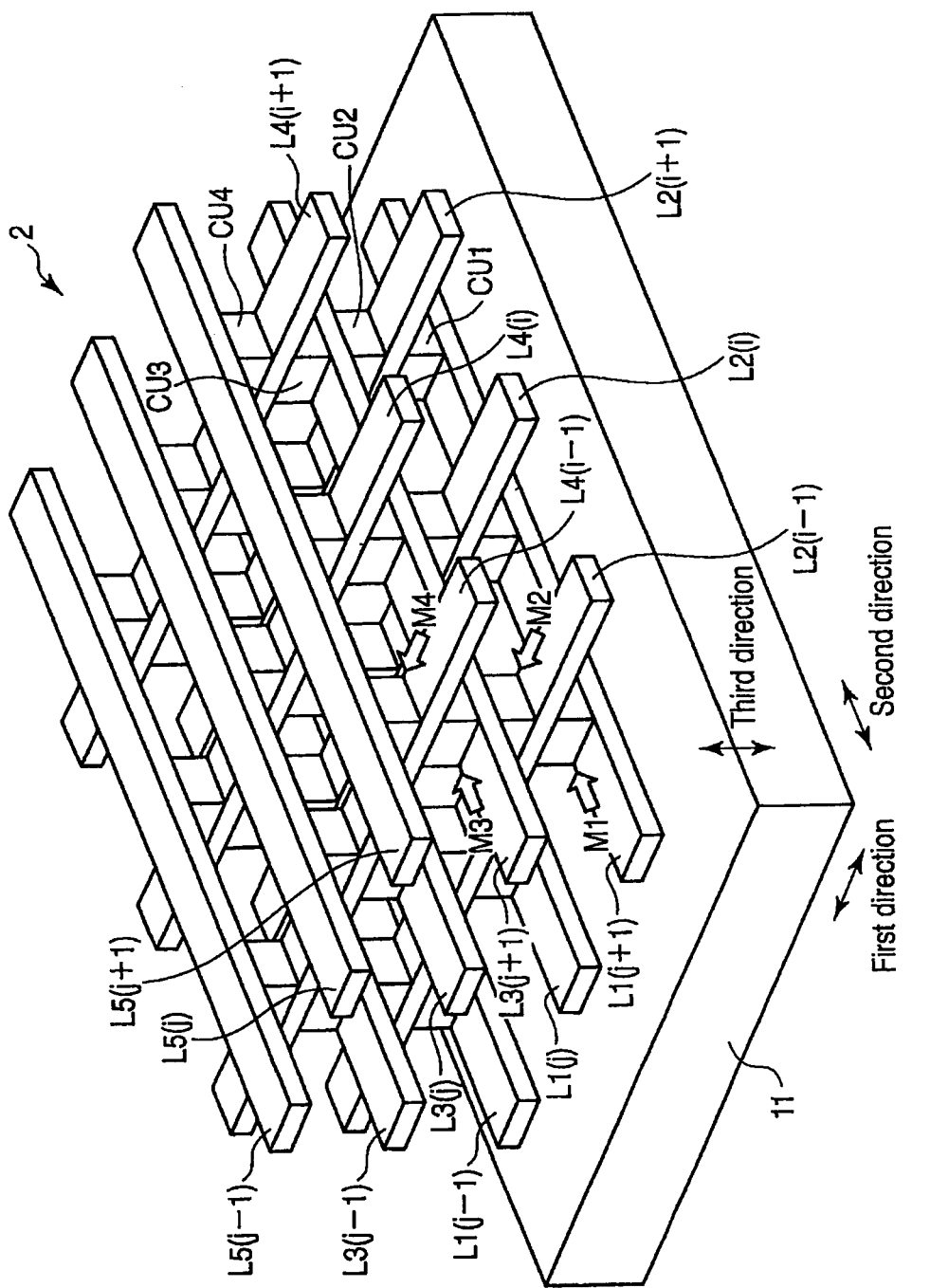
FIG. 2 is a diagram showing a cross-point type memory cell array.

Hereinafter, certain embodiments will be described in detail with reference to the drawings. In the following explanation, elements having the same function and configuration are provided with the same signs and are repeatedly described when necessary.

Embodiments are directed to a resistance change memory in which a variable resistive element or a phase change element serves as a memory element.

In general, according to one embodiment, a resistance change memory includes a first interconnect line extending in a first direction, a second interconnect line extending in a second direction intersecting with the first direction, and a cell unit which is provided at the intersection of the first interconnect line and the second interconnect line and which includes a memory element and a non-ohmic element that are connected in series. The memory element stores data in accordance with a change in a resistance state. The non-ohmic element includes a metal layer, a first semiconductor layer containing a first impurity, and a second semiconductor layer which is provided between the first semiconductor layer and the metal layer and which has an unevenly distributed layer.

[Embodiments]

<1> First Embodiment (1) Resistance Change Memory (a) Overall Configuration

A resistance change memory according to a first embodiment is described with FIG. 1 to FIG. 7.

FIG. 1 shows the main parts of the resistance change memory.

A resistance change memory (e.g., a chip) 1 has a cross-point type memory cell array 2.

For example, a first control circuit 3 is disposed at one end of the first direction of the cross-point type memory cell array 2, and a second control circuit 4 is disposed at one end of the second direction that intersects with the first direction.

The first control circuit 3 selects a row of the cross-point type memory cell array 2 on the basis of, for example, a row address signal. The second control circuit 4 selects a column of the cross-point type memory cell array 2 on the basis of, for example, a column address signal.

The first and second control circuits 3, 4 control writing, erasing and reading of data in a memory element within the memory cell array 2.

Here, in the resistance change memory 1 according to the present embodiment, for example, a write is referred to as a set, and an erasure is referred to as a reset. A resistance value in a set state has only to be different from a resistance value in a reset state, and whether the resistance value in the set state is higher or lower than that in the reset state makes no difference.

Moreover, if one of a plurality of levels of resistance values that can be marked by the memory element can be selectively written in a set operation, a multilevel resistance change memory in which one memory element stores multilevel data can be obtained.

A controller 5 supplies a control signal and data to the resistance change memory 1. The control signal is input to a command interface circuit 6, and the data is input to a data input/output buffer 7. The controller 5 may be disposed in the chip 1 or may be disposed in a chip (host device) different from the chip 1.

The command interface circuit 6 judges in accordance with the control signal whether data from the controller 5 is command data. When the data is command data, the command interface circuit 6 transfers the data from the input/output buffer 7 to a state machine 8.

The state machine 8 manages the operation of the resistance change memory 1 on the basis of the command data. For example, the state machine 8 manages the set/reset operations and read operation on the basis of command data from the controller 5. The controller 5 can receive status information managed by the state machine 8, and judge the result of the operation in the resistance change memory 1.

In the set/reset operations and read operation, the controller 5 supplies an address signal to the resistance change memory 1. The address signal is input to the first and second control circuits 3, 4 via an address buffer 9.

A potential supplying circuit 10 outputs, at a predetermined timing, a voltage pulse or current pulse necessary for, for example, the set/reset operations and read operation in accordance with an instruction from the state machine 8. The potential supplying circuit 10 includes, for example, a pulse generator 10A, and controls, in accordance with the operation indicated by the command data and control signal, the voltage value/current value and the pulse width of a voltage pulse/current pulse to output.

FIG. 2 is a bird's-eye view showing the structure of the cross-point type memory cell array.

The cross-point type memory cell array 2 is disposed on a substrate 11. The substrate 11 is a semiconductor substrate (e.g., a silicon substrate), or an interlayer insulating film on a semiconductor substrate. In addition, when the substrate 11 is an interlayer insulating film, a circuit that uses, for example, a field effect transistor may be formed as a peripheral circuit of the resistance change memory on the surface of a semiconductor substrate under the cross-point type memory cell array 2.

The cross-point type memory cell array 2 is configured by, for example, a stack structure of a plurality of memory cell arrays (also referred to as memory cell layers).

FIG. 2 shows, by way of example, the case where the cross-point type memory cell array 2 is composed of four memory cell arrays M1, M2, M3, M4 that are stacked in the third direction (a direction perpendicular to the main plane of the substrate 11). The number of memory cell arrays stacked has only to be two or more. In addition, the cross-point type memory cell array 2 may be configured by one memory cell array. Alternatively, an insulating film may be provided between two memory cell arrays stacked, and the two memory cell arrays may be electrically isolated by the insulating film.

When the plurality of memory cell arrays M1, M2, M3, M4 are stacked as in FIG. 2, the address signal includes, for example, a memory cell array selection signal, a row address signal and a column address signal. The first and second control circuits 3, 4 select one of the stacked memory cell arrays in accordance with, for example, the memory cell array selection signal. The first and second control circuits 3, 4 can write/erase/read data in one of the stacked memory cell arrays, or can simultaneously write/erase/read data in two or more or all of the stacked memory cell arrays.

The memory cell array M1 is composed of a plurality of cell units CU1 arrayed in the first and second directions. Similarly, the memory cell array M2 is composed of a plurality of arrayed cell units CU2, the memory cell array M3 is composed of a plurality of arrayed cell units CU3, and the memory cell array M4 is composed of a plurality of arrayed cell units CU4.

Furthermore, on the substrate 11, there are arranged, in order from the side of the substrate 11, interconnect lines L1 ($j$−1), L1 ($j$), L1 ($j$+1), interconnect lines L2 ($i$−1), L2 ($i$), L2 ($i$+1), interconnect lines L3 ($j$−1), L3 ($j$), L3 ($j$+1), interconnect lines L4 ($i$−1), L4 ($i$), L4 ($i$+1), and interconnect lines L5 ($j$−1), L5 ($j$), L5 ($j$+1).

The odd interconnect lines from the side of the substrate 11, that is, the interconnect lines L1 ($j$−1), L1 ($j$), L1 ($j$+1), the interconnect lines L3 ($j$−1), L3 ($j$), L3 ($j$+1) and the interconnect lines L5 ($j$−1), L5 ($j$), L5 ($j$+1) extend in the second direction.

The even interconnect lines from the side of the substrate 11, that is, the interconnect lines L2 ($i$−1), L2 ($i$), L2 ($i$+1) and the interconnect lines L4 ($i-1$), L4 ($i$), L4 ($i+1$) extend in the first direction that intersects with the second direction.

These interconnect lines are used as word lines or bit lines.

The lowermost first memory cell array M1 is disposed between the first interconnect lines L1 ($j-1$), L1 ($j$), L1 ($j+1$) and the second interconnect lines L2 ($i-1$), L2 ($i$), L2 ($i+1$). In the set/reset operations and read operation for the memory cell array M1, either the interconnect lines L1 ($j-1$), L1 ($j$), L1 ($j+1$) or the interconnect lines L2 ($i-1$), L2 ($i$), L2 ($i+1$) are used as word lines, and the other interconnect lines are used as bit lines.

The memory cell array M2 is disposed between the second interconnect lines L2 ($i-1$), L2 ($i$), L2 ($i+1$) and the third interconnect lines L3 ($j-1$), L3 ($j$), L3 ($j+1$). In the set/reset operations and read operation for the memory cell array M2, either the interconnect lines L2 ($i-1$), L2 ($i$), L2 ($i+1$) or the interconnect lines L3 ($j-1$), L3 ($j$), L3 ($j+1$) are used as word lines, and the other interconnect lines are used as bit lines.

The memory cell array M3 is disposed between the third interconnect lines L3 ($j-1$), L3 ($j$), L3 ($j+1$) and the fourth interconnect lines L4 ($i-1$), L4 ($i$), L4 ($i+1$). In the set/reset operations and read operation for the memory cell array M3, either the interconnect lines L3 ($j-1$), L3 ($j$), L3 ($j+1$) or the interconnect lines L4 ($i-1$), L4 ($i$), L4 ($i+1$) are used as word lines, and the other interconnect lines are used as bit lines.

The memory cell array M4 is disposed between the fourth interconnect lines L4 ($i-1$), L4 ($i$), L4 ($i+1$) and the fifth interconnect lines L5 ($j-1$), L5 ($j$), L5 ($j+1$). In the set/reset operations and read operation for the memory cell array M4, either the interconnect lines L4 ($i-1$), L4 ($i$), L4 ($i+1$) or the interconnect lines L5 ($j-1$), L5 ($j$), L5 ($j+1$) are used as word lines, and the other interconnect lines are used as bit lines.

Here, the cell unit CU1 is disposed at the place where the interconnect lines L1 ($j-1$), L1 ($j$), L1 ($j+1$) intersect with the interconnect lines L2 ($i-1$), L2 ($i$), L2 ($i+1$). In similar fashion, the cell units CU2, CU3, CU4 are respectively disposed at the place where the interconnect lines L2 ($i-1$), L2 ($i$), L2 ($i+1$) intersect with the interconnect lines L3 ($j-1$), L3 ($j$), L3 ($j+1$), at the place where the interconnect lines L3 ($j-1$), L3 ($j$), L3 ($j+1$) intersect with the interconnect lines L4 ($i-1$), L4 ($i$), L4 ($i+1$), and at the place where the interconnect lines L4 ($i-1$), L4 ($i$), L4 ($i+1$) intersect with the interconnect lines L5 ($j-1$), L5 ($j$), L5 ($j+1$). That is, in the cross-point type memory cell array 2, the cell unit is disposed at the intersection of the interconnect lines stacked in succession in the third direction.

When stacked two memory cell arrays are isolated from each other in the respective layers by the insulating film, the interconnect lines extending in the first and second directions are not shared by the stacked two memory cell arrays, and interconnect lines as word lines and bit lines are provided for each memory cell array in each layer.

Figure 3:
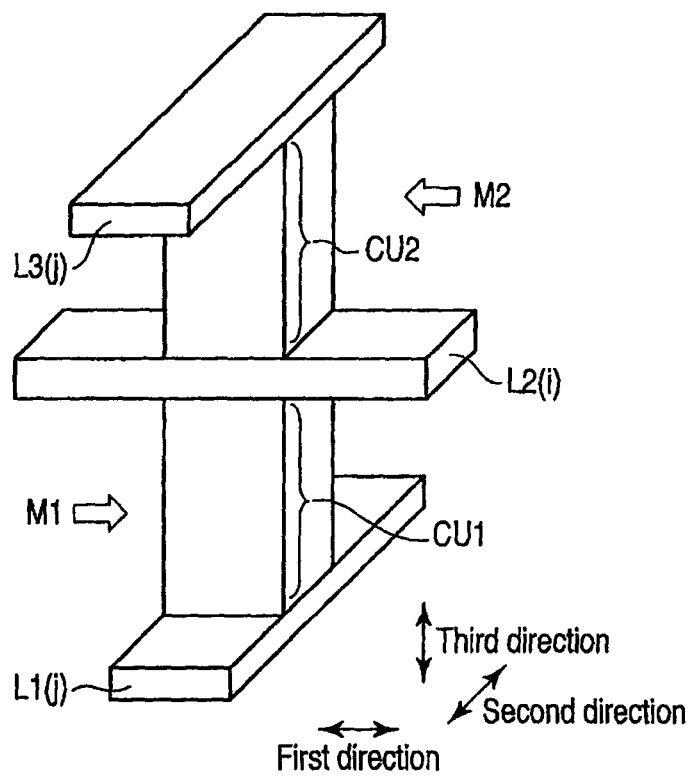
FIG. 3 is a diagram showing cell units.

FIG. 3 shows one example of the structures of the interconnect lines and the cell units in the cross-point type memory cell array.

In FIG. 3, the cell units CU1, CU2 in two memory cell arrays M1, M2 in FIG. 2 are shown. In this case, the cell units in the two memory cell arrays M3, M4 in FIG. 2 are the same in configuration as the cell units in two memory cell arrays M1, M2 in FIG. 2.

The stacked cell units CU1, CU2 share one interconnect line L2 ($i$).

One end of the current path of the cell unit CU1 is connected to the interconnect line L1 ($j$), and the other end of the current path of the cell unit CU1 is connected to the interconnect line L2 ($i$). One end of the current path of the cell unit CU2 is connected to the interconnect line L2 ($i$), and the other end of the current path of the cell unit CU2 is connected to the interconnect line L3 ($j$).

Each of the cell units CU1, CU2 is composed of a memory element and a non-ohmic element. The memory element and the non-ohmic element are connected in series. For example, a rectification element is used for the non-ohmic element.

There are various patterns of the connection between the memory element and the rectification element as the non-ohmic element. However, all the cell units in one memory cell array need to be the same in the connection between the memory element and the rectification element.

Figure 4:
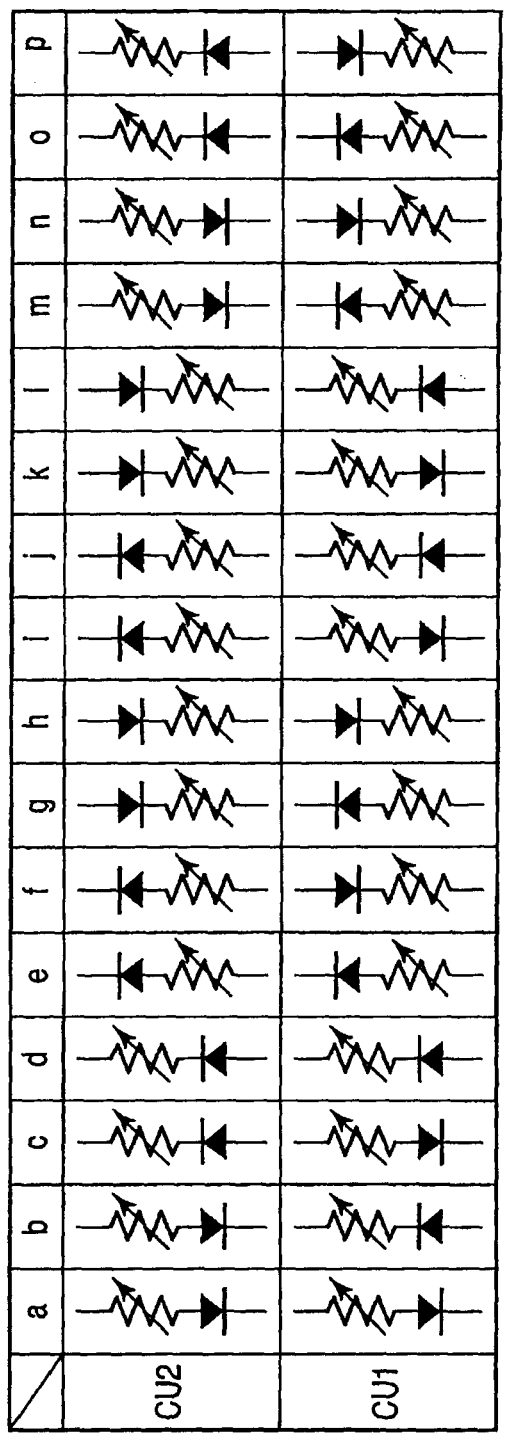
FIG. 4 is a diagram showing the connection between a memory element and a rectification element.

FIG. 4 shows the connection between the memory element and the rectification element.

In one cell unit, there are a total of four patterns of the connection between the memory element and the rectification element; two patterns of the positional relation between the memory element and the rectification element, and two patterns of the direction of the rectification element. Therefore, there are sixteen patterns (four patterns×four patterns) of the connection between the memory element and the rectification element regarding the cell units in two memory cell arrays. a to p of FIG. 4 denote sixteen patterns of connection. The embodiments are applicable to all of the sixteen patterns of connection.

Figure 5B:
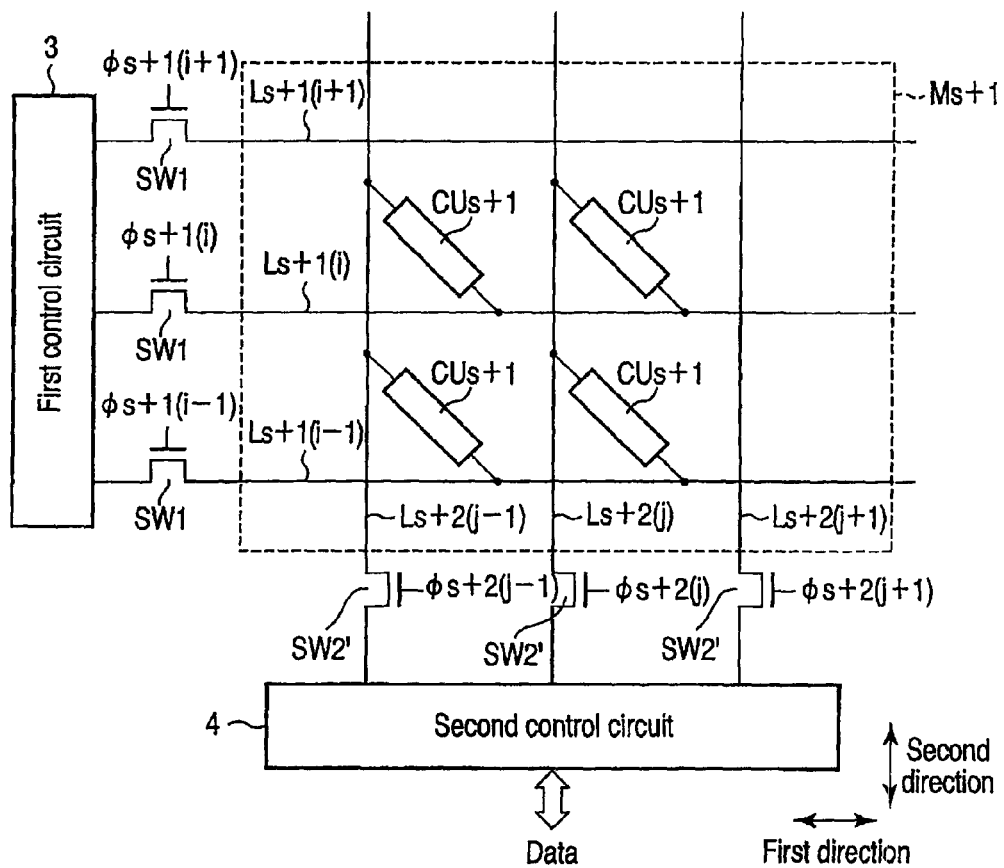
FIG. 5B is a diagram showing the layout of the first and second control circuits.

FIG. 5A and FIG. 5B show a first example of the layout of the first and second control circuits.

A memory cell array Ms in FIG. 5A corresponds to one of the memory cell arrays M1, M2, M3, M4 shown in FIG. 2. As shown in FIG. 5A, the memory cell array Ms is composed of a plurality of arrayed cell units CUs. The cell units CUs are connected on one end to interconnect lines Ls ($j-1$), Ls ($j$), Ls ($j+1$), and connected on the other end to interconnect lines Ls+1 ($i-1$), Ls+1 ($i$), Ls+1 ($i+1$).

As shown in FIG. 5B, a memory cell array Ms+1 is composed of a plurality of arrayed cell units CUs+1. The cell units CUs+1 are connected on one end to interconnect lines Ls+1 ($i-1$), Ls+1 ($i$), Ls+1 ($i+1$), and connected on the other end to interconnect lines Ls+2 ($j-1$), Ls+2 ($j$), Ls+2 ($j+1$).

Here, s is 1, 3, 5, 7, . . . in FIG. 5A and FIG. 5B.

The first control circuit 3 is connected to the interconnect lines Ls+1 ($i-1$), Ls+1 ($i$), Ls+1 ($i+1$) on one end in the first direction via switch elements SW1. The switch elements SW1 are controlled by, for example, control signals Zs+1 ($i-1$), Zs+1 ($i$), Zs+1 ($i+1$). The switch element SW1 is configured by, for example, an N-channel field effect transistor (FET).

The second control circuit 4 is connected to the interconnect lines Ls ($j-1$), Ls ($j$), Ls ($j+1$) on one end in the second direction via switch elements SW2. The switch elements SW2 are controlled by, for example, control signals Zs ($j-1$), Zs ($j$), Zs ($j+1$). The switch element SW2 is configured by, for example, an N-channel FET.

The second control circuit 4 is connected to the interconnect lines Ls+2 ($j-1$), Ls+2 ($j$), Ls+2 ($j+1$) on one end in the second direction via switch elements SW2'. The switch elements SW2' are controlled by, for example, control signals Zs+2 ($j-1$), Zs+2 ($j$), Zs+2 ($j+1$). The switch element SW2' is configured by, for example, an N-channel FET.

FIG. 6 shows a second example of the layout of the first and second control circuits. In addition, in FIG. 6, the internal configuration of the memory cell arrays Ms, Ms+1, Ms+2, Ms+3 is substantially the same as that of the memory cell array shown in FIG. 5A or FIG. 5B and is therefore not shown.

The layout in the second example is different from the layout in the first example in that the first control circuits 3 are disposed at both ends of the first direction of the memory cell array Ms, Ms+1, Ms+2, Ms+3 and in that the second control circuits 4 are disposed at both ends of the second direction of the memory cell array Ms, Ms+1, Ms+2, Ms+3. Here, s in FIG. 6 is 1, 5, 9, 13, . . . .

The first control circuits 3 are connected to the interconnect lines Ls+1 (i−1), Ls+1 (i), Ls+1 (i+1) on both ends in the first direction via the switch elements SW1. The switch elements SW1 are controlled by, for example, the control signals Zs+1 (i−1), Zs+1 (i), Zs+1 (i+1), Zs+3 (i−1), Zs+3 (i), Zs+3 (i+1). The switch element SW1 is configured by, for example, an N-channel FET.

The second control circuits 4 are connected to the interconnect lines Ls (j−1), Ls (j), Ls (j+1) on both ends in the second direction via the switch elements SW2. The switch elements SW2 are controlled by, for example, the control signals Zs (j−1), Zs (j), Zs (j+1), Zs+2 (j−1), Zs+2 (j), Zs+2 (j+1). The switch element SW2 is configured by, for example, an N-channel FET.

(b) Operation

Figure 7C:
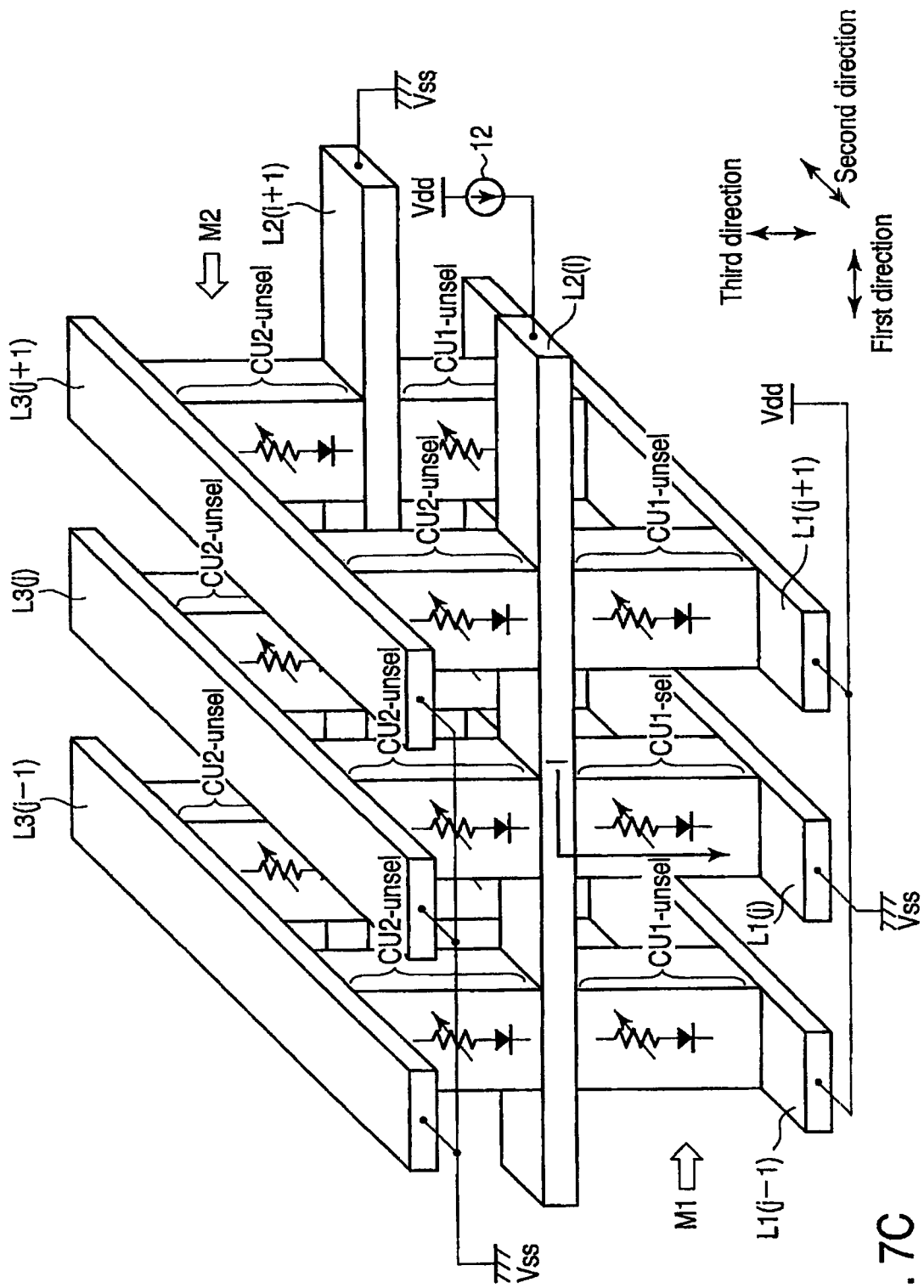
FIG. 7C is a diagram illustrating the operation of the resistance change memory.

The operation of the resistance change memory according to the present embodiment is described with FIG. 7A to FIG. 7C.

The basic operation of the resistance change memory including the cross-point type memory cell array in which a memory element for a unipolar operation or a bipolar operation is used is described with reference to FIG. 7A and FIG. 7B.

One example of a memory element used in the resistance change memory is a memory element driven in an operation mode called the unipolar operation or bipolar operation. The resistance state of the memory element for the unipolar operation changes depending on the intensity of a voltage (or a current) supplied to the memory element. The resistance state of the memory element for the bipolar operation changes depending on the polarity of a voltage (or a current) supplied to the memory element.

FIG. 7A shows an example of set potentials of wiring lines in the resistance change memory that uses the memory element for the unipolar operation.

As shown in FIG. 7A, in the resistance change memory that uses the memory element for the unipolar operation, potentials of selected wiring lines L1 (j), L2 (j) are set for a cell unit 90 (sel) to be operated (hereinafter referred to as a selected cell unit) so that a forward bias may be applied to a non-ohmic element (e.g., a diode) of the cell unit 90. For example, a select potential Vs is applied to one wiring line L1(j) to which the selected cell unit 90 is connected, and 0 V is applied as a select potential to the other wiring line L2 (i) to which the selected cell unit 90 is connected. A potential difference between these select potentials is a voltage necessary to change the resistance state of the memory element.

To change the resistance value of the memory element for the unipolar operation, at least one of the potential difference between the wiring lines L1 (j), L2 (i) and a potential applying period is changed depending on whether to change the resistance state to a high-resistance state (reset) or a low-resistance state (set). As a result, a current/voltage that changes the resistance state of the memory element for the unipolar operation is supplied to the selected cell unit 90.

Furthermore, potentials of unselected wiring lines are controlled so that a reverse bias is applied to diodes in cell units (hereinafter referred to as unselected cell units) 99 (unsel) connected between unselected wiring lines L1 (j−1), L1 (j+1), L2 (i−1) and L2 (i+1). That is, a potential V1A (e.g., 0 V) is applied to the unselected wiring lines L1 (j−1), L1 (j+1), and a potential V1B (e.g., Vs) is applied to the unselected other wiring lines L2 (i−1), L2 (i+1).

Here, in one memory cell array, there are cell units (hereinafter referred to as half-selected cell units) 95 (hsel) connected between the selected wiring lines L1 (j), L2 (i) and the unselected wiring lines L1 (j−1), L1 (j+1), L2 (i−1) and L2 (i+1). The intensity (here, the potential Vs or 0 V) of the potentials V1A, V1B applied to the unselected wiring lines is properly set for the half-selected cell units 95 so that a potential difference between the terminals of the half-selected cell units 95 may be equal to an intensity of a voltage which does not change the resistance value of the memory element, for example, substantially equal to 0V.

Consequently, the resistance values of the memory elements in the cell units other than the selected cell units are prevented from changing.

FIG. 7B shows an example of set potentials of wiring lines in the resistance change memory that uses the memory element for the bipolar operation.

As shown in FIG. 7B, in the resistance change memory that uses the memory element for the bipolar operation, select potentials Vs, 0 V are applied to selected cell units to generate, across selected wiring lines L1 (j), L2 (i), a voltage/current that changes the resistance state of the memory element of the selected cell unit 90, as in the case of the memory element for the unipolar operation.

To change the resistance state of the memory element for the bipolar operation, one of the wiring lines L1 (j) and L2 (i) is set to a high potential (e.g., a potential Vs), and the other is set to a low potential (e.g., 0 V), depending on whether to change the resistance state to a high-resistance state or a low-resistance state. That is, in the memory element for the bipolar operation, a current is bidirectionally passed from one end of the memory cell to the other or from the other end to one end depending on the resistance state to change to. As a result, a voltage/current that changes the resistance state of the memory element for the bipolar operation is supplied to the selected cell unit 90.

When the memory element for the bipolar operation is used in the cross-point type memory cell array, the resistance state of the memory element for the bipolar operation changes if the potentials of the unselected wiring lines L1 (j−1), L1 (j+1), L2 (i−1) and L2 (i+1) are set so that the same intensity of a reverse bias may be applied as in the memory element for the unipolar operation. Therefore, the potentials (here, Vs/2) of the unselected wiring lines L1 (j−1), L1 (j+1), L2 (i−1) and L2 (i+1) are respectively set for the unselected cell units 99 so that the inter-terminal potential difference thereof may be substantially 0 V.

Furthermore, the potentials of the unselected wiring lines L1 (j−1), L1 (j+1), L2 (i−1) and L2 (i+1) are set for the half-selected cell units 95 to the intensity that does not change the resistance value of the memory element. Thus, as shown in FIG. 7B, the potentials of the unselected wiring lines L1 (j−1), L1 (j+1), L2 (i−1) and L2 (i+1) are set at, for example, Vs/2.

Consequently, the inter-terminal potential difference of the unselected cell units is substantially 0 V, and the inter-terminal potential difference of the half-selected cell units is Vs/2. Here, the potential difference Vs/2 and a current generated by this potential difference need to be at such intensity that hardly changes the resistance value of the memory element for the bipolar operation.

If the potentials of the wiring lines are properly set as shown in FIG. 7A and FIG. 7B, a voltage/current that changes the resistance state of the memory element can be applied to the selected cell unit 90, and the cell units 95, 99 other than the selected cell unit 90 can be prevented from changing in the resistance values of the memory elements thereof.

The operation for the cross-point type memory cell array including a plurality of memory cell arrays is described with reference to FIG. 7C.

FIG. 7C shows two memory cell arrays.

A memory cell array M1 corresponds to the memory cell array M1 shown in FIG. 2, and a memory cell array M2 corresponds to the memory cell array M2 shown in FIG. 2. The connection between the memory element and the non-ohmic element (e.g., a rectification element) in the cell unit CU1, CU2 corresponds to "a" of FIG. 4.

Here, the use of the memory element for the unipolar operation is illustrated, and the operation for two memory cell arrays is described.

A. Set Operation

The case where a writing (set) operation is performed on a selected cell unit CU1-sel in the memory cell array M1 is described.

The initial state of the selected cell unit CU1-sel is, for example, an erased (reset) state.

For example, the reset state is a high-resistance state (100 kΩ to 1 MΩ), and the set state is a low-resistance state (1 kΩ to 10 kΩ).

A selected interconnect line L2 ($i$) is connected to a high-potential-side power supply potential Vdd, and a selected interconnect line L1 ($j$) is connected to a low-potential-side power supply potential Vss (e.g., a ground potential).

Among first interconnect lines from the substrate side, unselected interconnect lines L1 ($j$−1), L1 ($j$+1) other than the selected interconnect line L1 ($j$) are connected to the power supply potential Vdd. Among second interconnect lines from the substrate side, an unselected interconnect lines L2 ($i$+1) other than the selected interconnect line L2 ($i$) are connected to the power supply potential Vss.

Furthermore, third unselected interconnect lines L3 ($j$−1), L3 ($j$), L3 ($j$+1) from the substrate side are connected to the power supply potential Vss.

In this case, a forward bias is applied to the rectification element (e.g., a diode) in the selected cell unit CU1-sel. Thus, a set current I-set from a constant current source 12 runs through the selected cell unit CU1-sel, and the resistance value of the memory element in the selected cell unit CU1-sel changes from the high-resistance state to the low-resistance state.

Here, in the set operation, a voltage of, for example, about 3 V to 6 V is applied to the memory element in the selected cell unit CU1-sel during a period (pulse width) of about 10 ns to 100 ns. The value of set current I-set passed through the memory element (high-resistance state) is, for example, about 1 and the density of this current is set at a value ranging from $1 \times 10^3$ to $1 \times 10^6$ A/cm$^2$.

On the other hand, a reverse bias is applied to the rectification element (diode) in the cell unit which is connected between the unselected interconnect lines L1 ($j$−1), L1 ($j$+1) and the unselected interconnect line L2 ($i$+1), among the unselected cell units CU1-unsel in the memory cell array M1. Similarly, a reverse bias is applied to the rectification element (diode) in the cell unit which is connected between the selected interconnect line L2 ($i$) and the unselected interconnect lines L3 ($j$−1), L3 ($j$), L3 ($j$+1), among unselected cell units CU2-unsel in the memory cell array M2.

In addition, the inter-terminal potential difference of the rectification element in the cell unit which is connected between the selected interconnect line L2 ($i$) and the unselected interconnect lines L3 ($j$−1), L3 ($j$+1) is set at substantially zero (Vdd-Vdd). Similarly, the inter-terminal potential difference of the rectification element in the cell unit which is connected between a selected interconnect line L3 ($j$) and the unselected interconnect line L2 ($i$+1) is set at substantially zero (Vss−Vss).

B. Reset Operation

Next described is the case where an erasing (reset) operation is performed on the selected cell unit CU1-sel in the memory cell array M1.

A selected interconnect line L2 ($i$) is connected to the high-potential-side power supply potential Vdd, and a selected interconnect line L1 ($j$) is connected to the low-potential-side power supply potential Vss.

Among the first interconnect lines from the substrate side, unselected interconnect lines L1 ($j$−1), L1 ($j$+1) other than the selected interconnect line L1 ($j$) are connected to the power supply potential Vdd. Among the second interconnect lines from the substrate side, an unselected interconnect line L2 ($i$+1) other than the selected interconnect line L2 ($i$) is connected to the power supply potential Vss.

Furthermore, the third unselected interconnect lines L3 ($j$−1), L3 ($j$), L3 ($j$+1) from the substrate side are connected to the power supply potential Vss.

In this case, a forward bias is applied to the rectification element in the selected cell unit CU1-sel. Thus, a reset current I-reset from the constant current source 12 runs through the selected cell unit CU1-sel, and the resistance value of the memory element in the selected cell unit CU1-sel changes from the low-resistance state to the high-resistance state.

Here, in the reset operation, a voltage of about 0.5 V to 3 V is applied to the memory element in the selected cell unit CU1-sel during a period (pulse width) of about 200 ns to 1 μs. The reset current I-reset passed through the memory element (low-resistance state) is about 1 μA to 100 μA, and the density of this current is set at a value ranging, for example, from $1 \times 10^4$ to $1 \times 10^7$ A/cm$^2$.

On the other hand, a reverse bias is applied to the rectification element in the cell unit which is connected between the unselected interconnect lines L1 ($j$−1), L1 ($j$+1) and the unselected interconnect line L2 ($i$+1), among the unselected cell units CU1-unsel in the memory cell array M1. Similarly, a reverse bias is applied to the rectification element in the cell unit which is connected between the selected interconnect line L2 ($i$) and the unselected interconnect lines L3 ($j$−1), L3 ($j$), L3 ($j$+1), among the unselected cell units CU2-unsel in the memory cell array M2.

In addition, the inter-terminal potential difference of the rectification element in the cell unit which is connected between the selected interconnect line L2 ($i$) and the unselected interconnect lines L3 ($j$−1), L3 ($j$+1) is set at substantially zero (Vdd-Vdd). Similarly, the inter-terminal potential difference of the rectification element in the cell unit which is connected between a selected interconnect line L3 ($i$) and the unselected interconnect line L2 ($i$+1) is set at substantially zero (Vss−Vss).

In addition, the value of the set current I-set and the value of the reset current I-reset are different from each other. Moreover, when the set/reset operation of the memory element depends on the pulse width of the current/voltage, the pulse width of the set current and the pulse width of the reset current are different from each other. The voltage value, current value or period (pulse width) applied to the memory element in the selected cell unit CU1-sel depends on the materials constituting the memory element.

In the set/reset operation, a potential higher than the low-potential-side power supply potential Vss may be applied to an unselected interconnect line connected to an unselected cell unit to charge this interconnect line in advance for the next operation in the case of a configuration that has a connection whereby a predetermined potential difference can be applied to a selected cell unit and whereby a reverse bias or potential difference of 0 V can be applied to the unselected cell unit, among the configurations of the stacked cell units shown in a to p of FIG. 4. This makes it possible to reduce the time for charging the interconnect lines in the next operation cycle and increase the operation speed of the memory.

C. Read Operation

Next described is the case where a read operation is performed on the selected cell unit CU1-sel in the memory cell array M1.

A selected interconnect line L2 ($i$) is connected to the high-potential-side power supply potential Vdd, and a selected interconnect line L1 ($j$) is connected to the low-potential-side power supply potential Vss.

Among the first interconnect lines from the substrate side, unselected interconnect lines L1 ($j$−1), L1 ($j$+1) other than the selected interconnect line L1 ($j$) are connected to the power supply potential Vdd. Among the second interconnect lines from the substrate side, an unselected interconnect line L2 ($i$+1) other than the selected interconnect line L2 ($i$) is connected to the power supply potential Vss.

Furthermore, third unselected interconnect lines L3 ($j$−1), L3 ($j$), L3 ($j$+1) from the substrate side are connected to the power supply potential Vss.

In this case, a forward bias is applied to the rectification element (e.g., a diode) in the selected cell unit CU1-sel. Thus, the read current I-read from the constant current source 12 runs through the memory element in the selected cell unit CU1-sel (the high-resistance state or the low-resistance state).

Therefore, for example, by detecting a potential change in a sense node when the read current I-read is running through the memory element, data (resistance value) in the memory element can be read.

Here, the value of the read current I-read needs to be much lower than the value of the set current I-set and the value of the reset current I-reset so that the resistance value of the memory element may not change in reading. When the change of the resistance value of the memory element depends on the pulse width of the current, the pulse width of the read current has to be set at a pulse width that does not change the resistance value of the memory element.

In reading, as in setting/resetting, a reverse bias is applied to the rectification element in the cell unit which is connected between the unselected interconnect lines L1 ($j$−1), L1 ($j$+1) and the unselected interconnect line L2 ($i$+1), among the unselected cell units CU1-unsel in the memory cell array M1. A reverse bias is also applied to the rectification element in the cell unit which is connected between the unselected interconnect line L2 ($i$) and the unselected interconnect lines L3 ($j$−1), L3 ($j$), L3 ($j$+1), among the unselected cell units CU2-unsel in the memory cell array M2.

The set/reset operation and read operation of the resistance change memory are performed as described above.

Depending on the characteristics of the memory element, the resistance change memory can combine the unipolar operation and the bipolar operation to drive the memory cell array. For example, the memory element and the memory cell array are driven in the operation mode of the unipolar operation during the reset operation, and the memory element and the memory cell array are driven in the operation mode of the bipolar operation during the set operation.

The following characteristics are required for the rectification element as the non-ohmic element: a high current (forward current) when a forward bias is applied to the rectification element, and a sufficiently high breakdown voltage.

Furthermore, when a reverse bias is applied, a pim diode 30A used in the resistance change memory according to the present embodiment allows a sufficiently low current (a reverse current or an off-current) in an operation region less than a given reverse bias voltage (absolute value) and a high current (an on-current) in an operation region equal to or more than the given reverse bias voltage. Thus, the pim diode 30A according to the present embodiment can be applied to the memory elements for the unipolar operation and the bipolar operation as a non-ohmic element of the cell unit.

(2) Basic Example

A basic example of the resistance change memory according to the first embodiment is described with FIG. 8 to FIG. 11B.

(a) Structure

Figure 8:
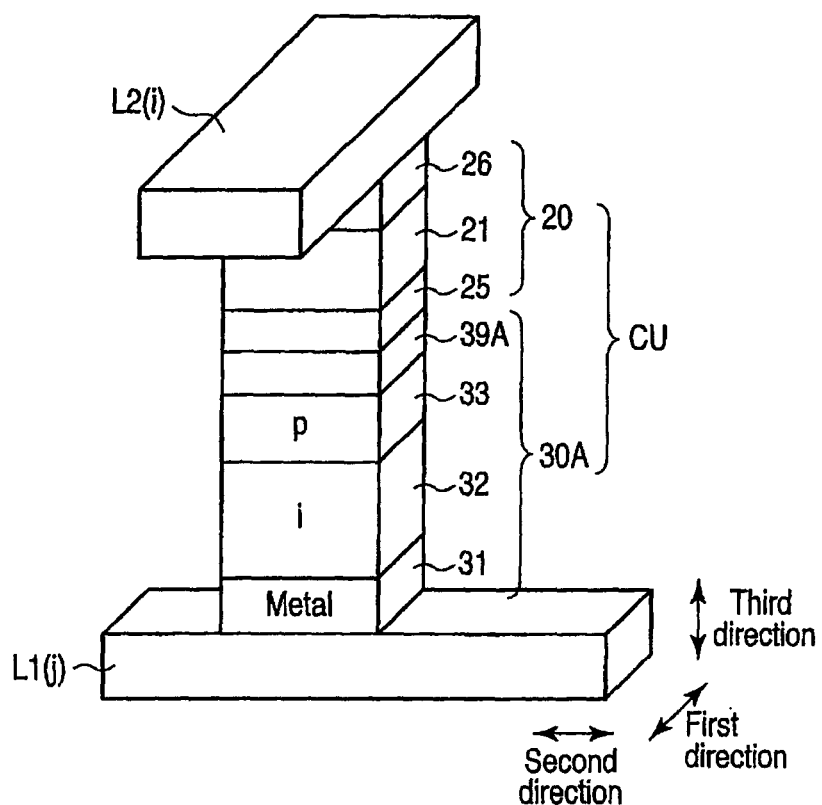
FIG. 8 is a diagram showing a basic example of the cell unit of the resistance change memory according to a first embodiment.
Figure 9:
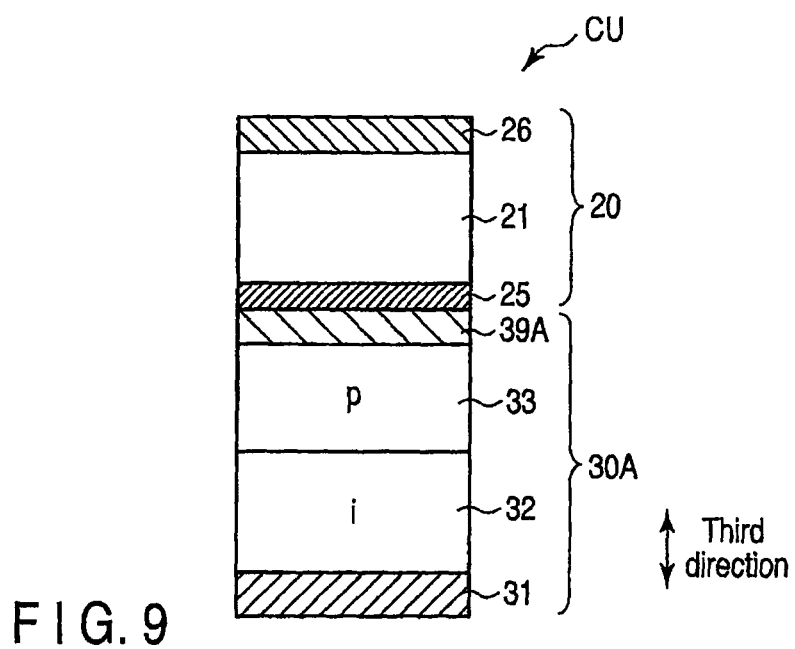
FIG. 9 is a diagram showing a basic example of the cell unit of the resistance change memory according to the first embodiment.

FIG. 8 shows a bird's-eye view of the basic example of the cell unit used in the resistance change memory according to the present embodiment. FIG. 9 shows the sectional structure of the cell unit used in the resistance change memory according to the present embodiment. Although the connection relation of the cell unit CU1 indicated by "a" of FIG. 4 is shown in FIG. 8 and FIG. 9, the embodiments are not limited to the example of "a" of FIG. 4.

In the cell unit CU shown in FIG. 8 and FIG. 9, a memory element 20 is stacked on a non-ohmic element 30A, and the memory element 20 and the non-ohmic element 30A are connected in series. A stack composed of the memory element 20 and the non-ohmic element 30A is interposed as one cell unit CU between two interconnect lines L1 ($j$), L2 ($j$). In addition, the structure of the cell unit CU shown in FIG. 8 and FIG. 9 is one example, and the non-ohmic element 30A may be stacked on the memory element 20 depending on the connection in the cell unit shown in FIG. 4.

The memory element 20 is a variable resistive element or a phase change element. Here, the term variable resistive element means an element made of a material with a resistance value that changes upon application of, for example a voltage, a current or heat. The term phase change element means an element made of a material with a physicality (impedance) such as a resistance value or capacitance that changes with a phase change of a crystal layer caused by provided energy.

The phase change (phase transition) includes the following:

Metal-semiconductor transition, metal-insulator transition, metal-metal transition, insulator-insulator transition, insulator-semiconductor transition, insulator-metal transition, semiconductor-semiconductor transition, semiconductor-metal transition, semiconductor-insulator transition Phase change of quantum state (e.g., metal-superconductor transition)

Paramagnet-ferromagnet transition, antiferromagnet-ferromagnet transition, ferromagnet-ferromagnet transition, ferrimagnet-ferromagnet transition, or combination of the above transitions Paraelectric-ferromagnet transition, paraelectric-pyroelectric transition, paraelectric-piezoelectric transition, ferroelectric-ferroelectric transition, antiferroelectric-ferroelectric transition, or combination of the above transitions Combination of the above transitions For example, transition to a ferroelectric-ferromagnet from a metal, insulator, semiconductor, ferroelectric, paraelectric, pyroelectric, piezoelectric, ferromagnet, ferrimagnet, helimagnet, paramagnet or antiferromagnet, and reverse transition In accordance with the above definition, the variable resistive element includes the phase change element.

In the present embodiment, the memory element 20 is mainly made of, for example, a metal oxide (e.g., a binary or ternary metal oxide), a metal compound, a chalcogenide material (e.g., Ge—Sb—Te, In—Sb—Te), organic matter, carbon, or carbon nanotube.

In addition, the resistance value of a magnetoresistive effect element used for a magnetoresistive RAM (MRAM) changes when the relative directions of the magnetizations of two magnetic layers constituting this element change. In the present embodiment, a magnetoresistive effect element such as a magnetic tunnel junction (MTJ) element is also included in the variable resistive element.

As a means of changing the resistance value of the memory element 20, there are an operation called a bipolar operation and an operation called a unipolar operation.

In the bipolar operation, the polarity of a voltage applied to the memory element 20 is changed to cause a reversible change in the resistance value of the memory element 20 between at least a first value (first level) and a second value (second level). The bipolar operation is bi-directional passage of a given intensity of current through the memory element during writing, for example, as in a spin injection type MRAM.

In the unipolar operation, one or both of the intensity and application time (pulse width) of a voltage is controlled without changing the polarity of the voltage applied to the memory element to cause a reversible change in the resistance value of the memory element between at least the first value and the second value.

The memory element 20 has electrode layers 25, 26 on one end and the other in the third direction (stacking direction). The electrode layer 25 is provided on the bottom of the memory element 20, and the electrode layer 26 is provided on the top of the memory element 20. The electrode layers 25, 26 are used as, for example, electrodes of the memory elements. For the electrode layer 25, 26, for example, a metal film, a metal compound film, a conductive semiconductor film or a stack of these films is used.

In the present embodiment, a portion interposed between two electrode layers 25, 26 is called a resistance change film 21. The resistance change film 21 is a film made of a material having a resistance value or crystal phase that changes due to energy such as a voltage, a current or heat. The resistance change film 21 is made of a material having such a property that the film itself changes in the resistance value or crystal phase due to energy applied thereto. Otherwise, the resistance change film 21 may be made of a material having such a property that the resistance value (or crystal phase) of the memory element changes as a result of a characteristic change in the interface between the resistance change film 21 and the electrode layers 25, 26 due to energy applied thereto. In this case, the resistance value changing property of the memory element 20 is determined by the combination of the material used for the resistance change film 21 and the material used for the electrode layers 25, 26.

The resistance change film 21 may be made of a material containing impurity atoms that form a defect level, or a material containing semiconductor/metal dots (quantum dots).

For example, the resistance state of the resistance change film 21 changes with the movement of ions that constitute the resistance change film 21, the production or disappearance of a micro current path (referred to as a filament) formed in the resistance change film 21, the production or disappearance of a trap in the resistance change film 21, or a characteristic change of the resistance change film resulting from the above-mentioned phase transition (phase change).

The electrode layers 25, 26 may function as diffusion preventing layers. The diffusion preventing layer prevents impurities derived from the lower element 30A and derived from the interconnect line L2 (i) from diffusing into the memory element 20, or prevents impurities derived from the memory element 20 from diffusing into the lower element 30A and the interconnect line L2 (i). The electrode layers 25, 26 may also function as adhesive layers for preventing the memory element 20 from being detached from the lower element 30A and the interconnect line L2 (i).

The non-ohmic element 30A is an element having no linearity in its input/output characteristics (voltage-current characteristics), that is, having a non-ohmic property in its input/output characteristics.

The non-ohmic element 30A according to the present embodiment has a stack structure composed of one conductive layer 31 and two semiconductor layers 32, 33, and this stack structure serves as the main component to obtain non-ohmic characteristics.

The non-ohmic element 30A has conductive layers 31, 39A on one end and the other in the third direction (stacking direction). The conductive layer 31 is provided at the bottom of the non-ohmic element 30A. The conductive layer 31 is provided on, for example, the interconnect line L1 (j).

The conductive layer 31 is made of a metal or a metal compound. The conductive layer 31 as a component of the non-ohmic element 30A is hereinafter referred to as a metal layer 31. By way of example, the metal layer 31 is made of titanium nitride (TiN). The thickness of the metal layer 31 is, for example, about 10 nm.

The metal layer 31 is also used as an electrode of the non-ohmic element 30A. The metal layer 31 electrically connects the non-ohmic element 30A and the interconnect line. The metal layer 31 is in direct contact with, for example, the interconnect line L1 (j).

The semiconductor layer 32 is provided on the metal layer 31. The semiconductor layer 32 is, for example, an intrinsic semiconductor layer. The intrinsic semiconductor layer means a semiconductor layer to which no impurity is added or a semiconductor layer containing a small amount of impurity that is negligible to intrinsic carrier density. The intrinsic semiconductor layer 32 as a component of the non-ohmic element 30A is hereinafter referred to as an i-type layer 32.

The i-type layer 32 is made of, for example, silicon (Si), silicon germanium (SiGe) or silicon tin (SiSn). However, the i-type layer 32 is not exclusively a semiconductor layer containing Si as the main component, and may be made of gallium arsenide (GaAs) or a compound semiconductor such as an oxide or nitride.

The thickness of the i-type layer 32 is, for example, about 60 nm to 120 nm.

The semiconductor layer 33 is provided on the i-type layer 32. The semiconductor layer 33 is, for example, a p-type semiconductor layer 33. The p-type semiconductor layer 33 as a component of the non-ohmic element 30A is hereinafter referred to as a p-type layer 33.

The p-type layer 33 is, for example, an Si layer to which boron (B) is added as an impurity (acceptor). However, the semiconductor layer 33 may be a semiconductor layer such as a SiGe layer containing Si as the main component or a compound semiconductor layer as long as the semiconductor layer 33 is a p-type semiconductor layer.

For example, the acceptor impurity concentration of the p-type layer 33 is, for example, about $10^{19}/cm^3$ to $10^{22}/cm^3$. The thickness of the p-type layer 33 is, for example, about 3 nm to 15 nm.

The conductive layer 39A is provided on the p-type layer 33. The non-ohmic element 30A is electrically connected to the electrode layer 25 of the memory element 20 via, for example, the conductive layer 39A. Thus, the non-ohmic element 30A and the memory element 20 are connected in series. The conductive layer 39A is made of one selected from the group consisting of a silicide, metal, metal compound, conductive semiconductor and a stack of these materials.

In the non-ohmic element 30A shown in FIG. 8 and FIG. 9, the p-type layer 33 is used as an anode (anode layer) of the non-ohmic element, and the metal layer 31 is used as a cathode (cathode layer) of the non-ohmic element.

The non-ohmic element 30A including the p-type layer, the i-type layer and the metal layer is hereinafter referred to as a pim diode 30A.

In the pim diode 30A described in the present embodiment, the Fermi level of the metal layer 31 is preferably located on the side of the conduction band of the i-type layer 32. Moreover, the work function of the metal layer 31 is preferably equal to or less than the work function of the i-type layer 32. For example, when the i-type layer is made of intrinsic Si, the material (conductor) having a work function of about 3.5 eV to 4.7 eV is used for the metal layer 31.

The position to form resistance change film 21 is not limited as long as the rectification properties of the pim diode 30A do not deteriorate.

Owing to an operation mechanism described later, the pim diode 30A used in the resistance change memory according to the present embodiment enables a high current (forward current) when a forward bias is applied, and a sufficiently high breakdown voltage.

Furthermore, when a reverse bias is applied, the pim diode 30A used in the resistance change memory according to the present embodiment allows a sufficiently low output current (a reverse current or an off-current) in the operation region of the diode less than a given reverse bias voltage (absolute value) and a high output current (an on-current) in the operation region of the diode equal to or more than the given reverse bias voltage. Thus, the pim diode 30A according to the present embodiment can be applied to the memory elements for the unipolar operation and the bipolar operation as a non-ohmic element of the cell unit.

(b) Operation Mechanism

The operation mechanism of the non-ohmic element (pim diode) 30A used in the resistance change memory according to the present embodiment is described with FIG. 10A to FIG. 10D.

Figure 10A:
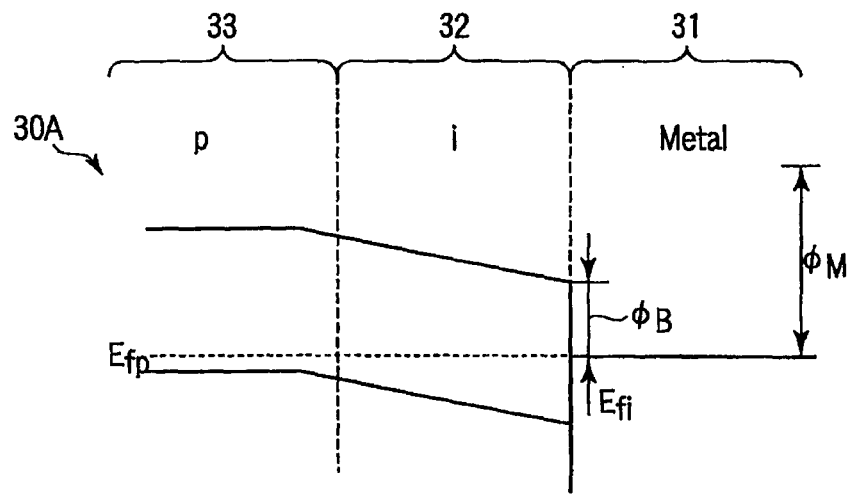
FIG. 10A is a graph illustrating the operation principle of a non-ohmic element.

FIG. 10A shows a band structure of the pim diode in the case where no bias is applied to the pim diode 30A according to the present embodiment. In FIG. 10A, the degree of the work function of the metal layer 31 of the pim diode 30A is indicated by "$\phi_M$". In FIG. 10A, the Fermi level of the i-type layer 32 of the pim diode 30A is indicated by "$E_{fi}$", and the Fermi level of the p-type layer 33 of the pim diode 30A is indicated by "$E_{fp}$". Moreover, a Schottky barrier created between the metal layer 31 and the i-type layer 32 is indicated by "$\phi_B$".

In the structure of the pim diode 30A in which the p-type semiconductor layer (p-type layer), the intrinsic semiconductor layer (i-type layer) and the metal layer are joined together, a band structure before its band modulation is as shown in FIG. 10A. When no bias is applied to the pim diode 30A, the i-type layer 32 is in a depleted state.

Figure 10B:
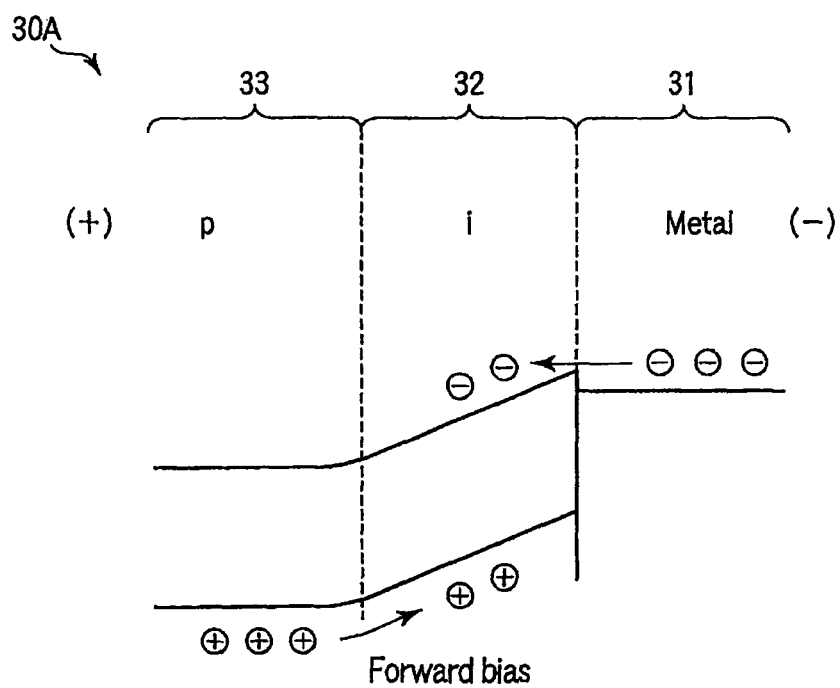
FIG. 10B is a graph illustrating the operation principle of the non-ohmic element.

FIG. 10B shows a band structure of the pim diode 30A in the case where a forward bias is applied to the pim diode 30A according to the present embodiment.

In the pim diode 30A according to the present embodiment, a condition in which a high potential is applied to the p-type layer 33 and in which a low potential is applied to the metal layer 31 is referred to as a forward bias.

When the forward bias is being applied to the diode 30A, the height of the barrier between the p-type layer 33 and the i-type layer 32 is reduced toward the metal layer 31. Holes are supplied to the p-type layer 33 as an anode (anode layer), and electrons are supplied to the metal layer 31 as a cathode (cathode layer). Further, the holes are injected to the valence band of the i-type layer 32 from the p-type layer 33, and the electrons are injected to the conduction band of the i-type layer 32 from the metal layer 31. The holes and electrons injected into the i-type layer 32 recombine in the i-type layer 32.

When the forward bias applied to the diode 30A is higher, a diffusion current (or a high injection current) is predominant, and a higher current runs to the metal layer 31 from the p-type layer 33.

Consequently, a current (forward current) is output from the pim diode 30A when the forward bias is being applied to the pim diode 30A according to the present embodiment.

FIG. 10C shows a band structure of the pim diode in the case where a reverse bias is applied to the pim diode according to the present embodiment.

In the pim diode 30A according to the present embodiment, a condition in which a low potential is applied to the p-type layer 33 and in which a high potential is applied to the metal layer 31 is referred to as a reverse bias.

As shown in FIG. 10C, when the reverse bias is applied to the pim diode 30A, the height of the barrier between the p-type layer 33 and the i-type layer 32 is increased toward the p-type layer 32, and a depletion layer is formed in the i-type layer 32. The size of the depletion layer is modulated in accordance with the intensity of the applied reverse bias voltage. Thus, the depletion layer may extend into the p-type layer 33.

In the pim diode 30A, the i-type layer 32 is provided between the p-type layer 33 and the metal layer 31, so that an inter-terminal electric field of the diode is eased, and inter-band bending is inhibited. Therefore, when a reverse bias lower than a certain voltage value is applied, tunneling of electrons is inhibited, and almost no current runs.

Therefore, when the reverse bias is applied to the pim diode 30A according to the present embodiment, the output current (reverse current) of the pim diode 30A is reduced.

In addition, in order to stabilize the operation of the pim diode according to the present embodiment, the thickness of the i-type layer 32 and the p-type layer 33 and the impurity concentration of the p-type layer 33 are preferably set properly so that the depletion layer is not formed on the entire p-type layer 33 of the pim diode 30A during the application of the reverse bias.

FIG. 10D shows the band structure of the pim diode 30A when a reverse bias higher than that in FIG. 10C is applied to the pim diode.

As shown in FIG. 10D, the voltage value (absolute value) of the reverse bias is increased, and a tunneling phenomenon occurs beyond a certain voltage value. For example, electrons in the valence band of the i-type layer 32 and the p-type layer 33 are moved to the metal layer 31 by direct tunneling or inter-band tunneling. Thus, carriers tunnel through the i-type layer 32, and then move between the p-type layer 33 and the metal layer 31. As a result, the pim diode 30A outputs a high reverse current (tunnel current).

Thus, during reverse bias application, the pim diode 30A rapidly outputs a high reverse current if a reverse bias equal to or higher than a predetermined voltage is applied.

As shown in FIG. 10C and FIG. 10D, during reverse bias application, the pim diode according to the present embodiment has an operation region in which almost no reverse current is output, and an operation region in which a high reverse current is output by the application of a reverse bias equal to or more than a threshold. Hereinafter, the operation region (or operation state) in which almost no reverse current is output is referred to as an off-region (off-state), and the operation region (or operation state) in which a high reverse current is output is referred to as an on-region (on-state). During the application of a reverse bias to the pim diode, a reverse current in the off-region is referred to as an off-current, a reverse current in the on-region is referred to as an on-current. During the application of a reverse bias to the pim diode, a threshold at which the diode is brought into the on-state is also referred to as an on-voltage.

Figure 11A:
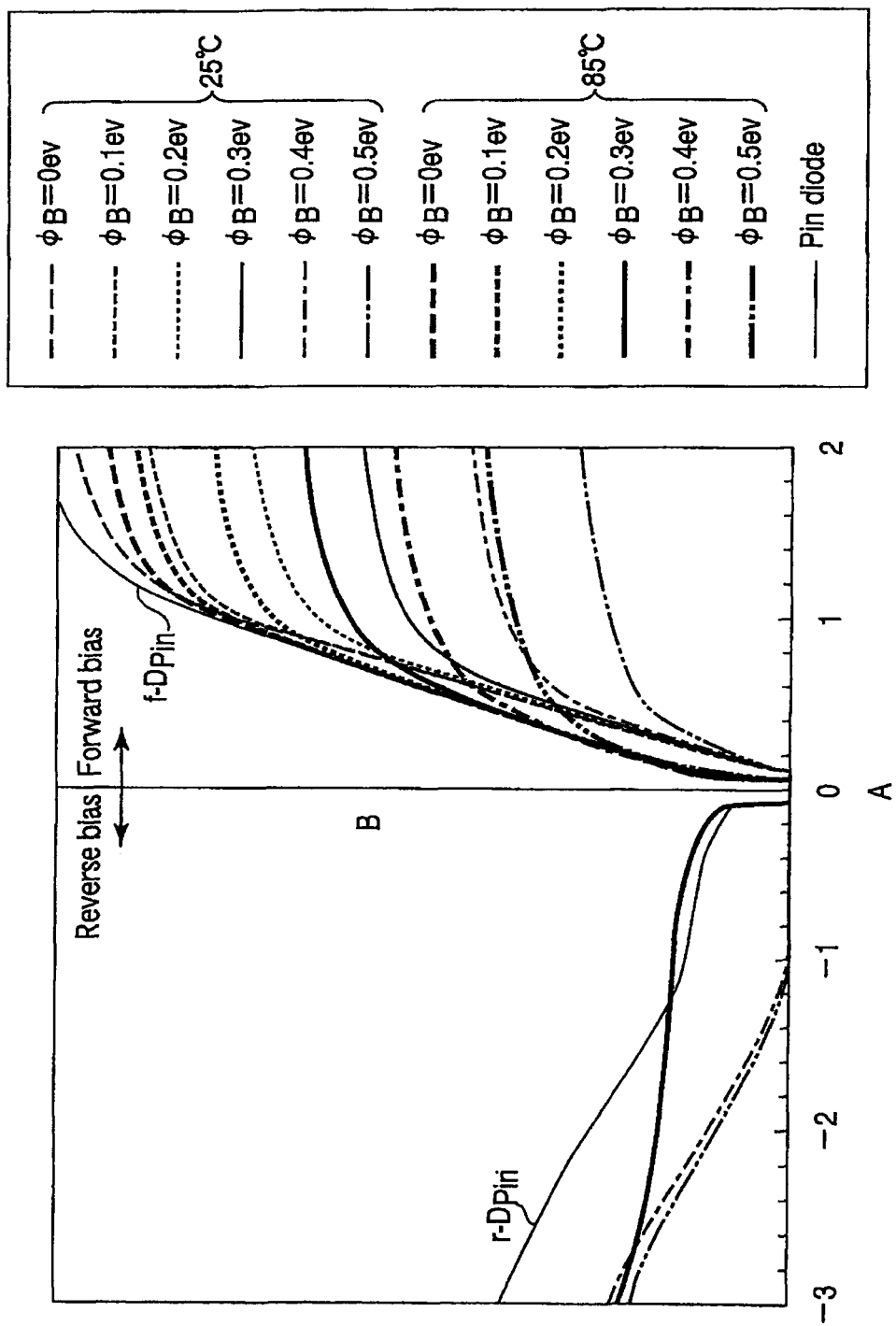
FIG. 11A is a graph illustrating the electric properties of the non-ohmic element according to the embodiment.
Figure 11B:
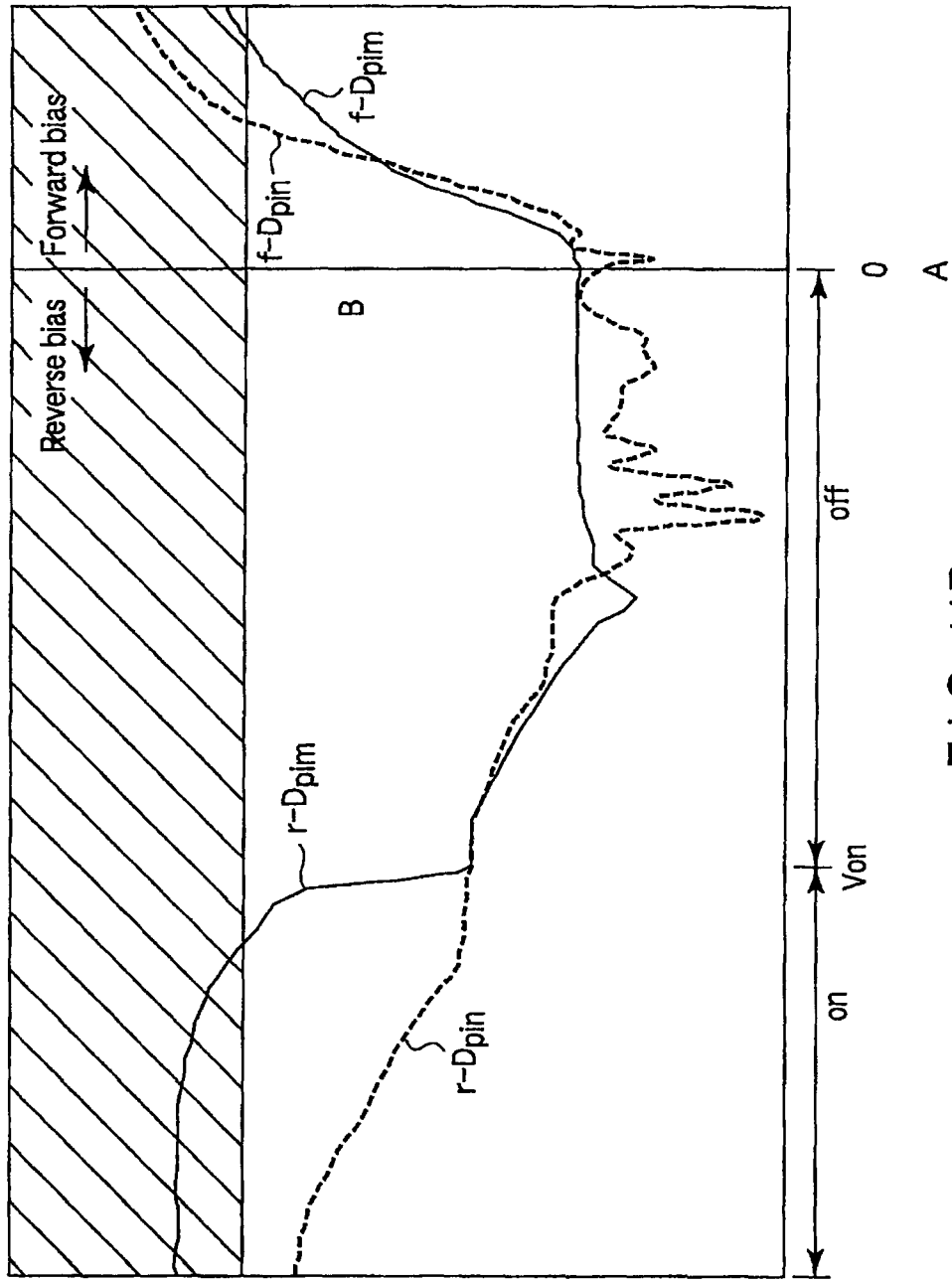
FIG. 11B is a graph illustrating the electric properties of the non-ohmic element according to the embodiment.

FIGS. 11A and 11B show simulation results of the electric properties of the pim diode used in the resistance change memory according to the present embodiment. V-I characteristics of the pim diode are shown in FIGS. 11A and 11B. In FIGS. 11A and 11B, the horizontal axis of the graph corresponds to the voltage (indicated by "A" in FIGS. 11A and 11B), and the vertical axis of the graph corresponds to the current (indicated by "B" in FIGS. 11A and 11B).

The V-I characteristics shown in FIG. 11A represent simulation results obtained by changing the height $\phi_B$ of the Schottky barrier at the junction of the i-type layer and the metal layer of the pim diode. FIG. 11A also shows the V-I characteristic when the temperature of the operating environment of the element is 25° C., and the V-I characteristic when the temperature is 85° C. In addition, in FIG. 11A, the number of shown simulation results of the reverse bias side output characteristics is smaller than the number of shown simulation results of the forward bias side output characteristics. The reason is that the simulation results of the reverse bias side output characteristics under the respective conditions indicate about the same current value and overlap one another.

In the pim diode used in the simulations shown in FIG. 11A, the thickness of the p-type layer is set at 5 nm, and the thickness of the i-type layer is set at 55 nm.

In FIG. 11A, V-I characteristics f-$D_{pin}$, r-$D_{pin}$ of a pin diode are shown as comparative examples of the V-I characteristics of the pim diode according to the present embodiment. The pin diode is a diode in which an i-type semiconductor layer is held between a p-type semiconductor layer and an n-type semiconductor layer (hereinafter referred to as an n-type layer). In the pin diode used in the simulations shown in FIG. 11A, the thickness of the p-type layer is set at 5 nm, the thickness of the i-type layer is set at 50 nm, and the thickness of the n-type layer is set at 5 nm. In addition, conductors are provided as electrode layers of the diode at one end (the surface of the p-type layer) of the pin diode and the other (the surface of the n-type layer). Therefore, the structure of the pim diode according to the present embodiment corresponds to the structure of the pin diode in which the n-type layer is omitted.

As shown in FIG. 11A, when the forward bias is applied to the pim diode 30A according to the present embodiment, the V-I characteristic of the pim diode shows that an output current (forward current) corresponding to the applied voltage (forward voltage) increases with the decrease of the Schottky barrier height $\phi_B$. This tendency remains the same even if the operating temperature of the pim diode changes.

As the Schottky barrier height $\phi_B$ decreases, the value of the forward current of the pim diode according to the present embodiment comes to about the same level as the value of the forward current f-$D_{pin}$ of the pin diode according to the comparative example. In other words, the forward current of the pim diode when the forward bias is applied is increased by the formation of an ohmic contact between the i-type layer and the metal layer.

When the pim diode described in the present embodiment is thus used, a forward bias characteristic of the rectification element preferable to improve the operation of the resistance change memory is obtained.

When the reverse bias is applied to the pim diode as shown in FIG. 11A, the output current (reverse current) corresponding to the reverse voltage is reduced as the Schottky barrier height $\phi_B$ decreases.

The reverse current in the off-state of the pim diode according to the present embodiment is about two digits lower than the reverse current r-$D_{pin}$ of the pin diode according to the comparative example.

When the pim diode described in the present embodiment is thus used, a reverse bias characteristic of the rectification element preferable to improve the operation of the resistance change memory is obtained.

Furthermore, when the height of the Schottky barrier between the i-type layer and the metal layer which are components of the pim diode is small, the rectification properties of the element improve.

This shows that the rectification properties of the pim diode according to the present embodiment do not originate in the Schottky junction of the i-type layer and the metal layer.

FIG. 11B shows measurements of electric properties when a reverse bias is applied to the pim diode used in the resistance change memory according to the present embodiment. In FIG. 11B, V-I characteristics f-$D_{pin}$, r-$D_{pin}$ of a pin diode are shown as comparative examples to V-I characteristics f-$D_{pim}$, r-$D_{pim}$ of the pim diode according to the present embodiment. It is to be noted that measurements are made in FIG. 11B in a region in which a reverse bias applied is higher than that in FIG. 11A.

As shown by the reverse bias characteristic r-$D_{pim}$ of the pim diode according to the present embodiment in FIG. 11B, the reverse current is low in the off-region up to a certain voltage value (on-voltage) Von when a reverse bias is applied. When the intensity of the reverse bias applied to the pim diode is equal to or more than the on-voltage Von, the value of the reverse current rapidly increases. During the application of the reverse bias to the pim diode, the intensity of the reverse current output in the on-region equal to or more than the on-voltage Von reaches the operation region (a shaded region in FIG. 11B) of the memory element where the resistance state of the memory element changes.

On the other hand, as shown in FIG. 11B, reverse current that reaches the operation region of the memory element is not output in the case of the reverse bias characteristic r-$D_{pin}$ of the pin diode even if a voltage value (absolute value) equal to or more than the voltage Von is applied.

Thus, in the reverse bias characteristics of the pim diode 30A according to the present embodiment, the off-region in which the reverse current (off-current) is sufficiently low can be obtained, and the reverse current (on-current) that changes the resistance state of the memory element for the bipolar operation can be output by an on-voltage lower than that of the pin diode.

As described above, in the resistance change memory according to the present embodiment, the pim diode as a component of the memory enables a characteristic that provides a high current (forward current) and a sufficiently high breakdown voltage during the application of a forward bias. The pim diode 30A used in the resistance change memory according to the present embodiment enables a sufficiently low reverse current (off-current) in the operation region lower than the on-voltage (absolute value) and a higher reverse current (on-current) in the operation region equal to or more than lower than the on-voltage (absolute value) when a reverse bias is applied.

As described above, in the resistance change memory according to the present embodiment, the pim diode as a constituent element of the memory enables the characteristics that include a high current (forward current) when a forward bias is applied, and a sufficiently high breakdown voltage.

The pim diode 30A used in the resistance change memory according to the present embodiment enables a sufficiently low reverse current (off-current) in the operation region lower than the on-voltage (absolute value) and a higher reverse current (on-current) in the operation region equal to or more than lower than the on-voltage (absolute value) when a reverse bias is applied.

Still further, the structure of the pim diode according to the present embodiment corresponds to the structure of the pin diode in which the n-type layer is omitted (however, an unevenly distributed layer may be included). Thus, the thickness (height) of the pim diode 30A can be smaller than the thickness of the pin diode. As a result, the aspect ratio of a gap made after the rectification element is processed is lower, which is advantageous when the memory cell array is configured into a three-dimensional form.

Still further, for example, even if the thickness of the pim diode is the same as the thickness of the pin diode, the thickness of the intrinsic semiconductor layer (i-type layer) can be great, so that the production (generation or supply) of electrons is suppressed. Thus, the off-characteristics (suppression of a leak current) and reverse bias characteristics (suppression of the reveres current) of the pim diode are improved, and the characteristics of the non-ohmic element can be improved.

Still further, instead of the p-type layer of the pin diode, the n-type layer thereof can be replaced with the metal layer, so that electrons can be supplied to the i-type layer from the metal layer having a number of electrons equal to or more than the number of electrons of the n-type layer. Consequently, the forward current of the non-ohmic element can be increased.

Moreover, the pim diode 30A according to the present embodiment outputs a high reverse current (tunnel current) when a reverse bias equal to or more than a certain threshold is applied. Thus, the pim diode 30A according to the present embodiment can supply the memory element with a bidirectionally running current to change the resistance state of the memory element for the bipolar operation. That is, the pim diode 30A can also improve the operation characteristics of the memory element for the bipolar operation.

In the memory element for the bipolar operation, the diode that constitutes the cell unit CU has an off-region in which an output current (off-current) is reduced both during a forward bias and a reverse bias, so that a current (on-current) that reaches the operation region both during a forward bias and a reverse bias is preferably output. That is, the diode for the memory element for the bipolar operation preferably has a high ratio between the on-current and the off-current (on/off ratio) both during a forward bias and a reverse bias. In the present embodiment, the on/off ratio is defined by (the value of the on-current)÷(the value of the off-current).

The pin diode can output a high forward current, and can hold down the reverse current in the off-state during a reverse bias. However, it is difficult for the pin diode to supply the memory element with a high on-current (a current for the operation of the memory element) in the on-state during a reverse bias. Even if the conditions for the i-type layer, the p-type layer and the n-type layer are changed, it is difficult for the pin diode to output a current that holds down the off-current and at the same time brings the memory element into the bipolar operation. In the pin diode, the on/off ratio deteriorates under the condition that increases the on-current during a reverse bias. As a result, when the pin diode is used in the cell unit that includes the memory element for the bipolar operation, device power consumption increases, and wrong operation occurs during reading and writing.

The operation principle of the pim diode 30A according to the present embodiment is different from that of the pin diode. Therefore, as shown in FIG. 11B, the pim diode 30A has an off-region during a reverse bias, and can output a current that reaches the operation region both during a forward bias and a reverse bias. Thus, the pim diode 30A according to the present embodiment is suitable for forming a cell unit together with the memory element for the bipolar operation as well as the memory element for the unipolar operation.

As described above, the pim diode 30A dose not have the n-type layer, and therefore allows the width (thickness) of the i-type layer to be greater. The current in the off-region can be suppressed by the increase of the width of the i-type layer 32. When a reverse bias is applied, the pim diode 30A is in the off-state at a voltage lower than a threshold voltage (on-voltage) and in the on-state at a voltage equal to or more than the threshold voltage, and allows a high reverse current to run. Thus, the pim diode 30A according to the present embodiment can improve the on/off ratio of the running current when driven.

(3) Example

An example of the resistance change memory according to the first embodiment is described with FIG. 12 to FIG. 18.

FIG. 12 to FIG. 17 show sectional structures of the cell unit of the example used in the resistance change memory according to the present embodiment. As long as the non-ohmic characteristics (rectification properties) are shown, various modifications can be made to the configuration of the pim diode 30A depending on the configuration and operation of the resistance change memory.

Figure 12:
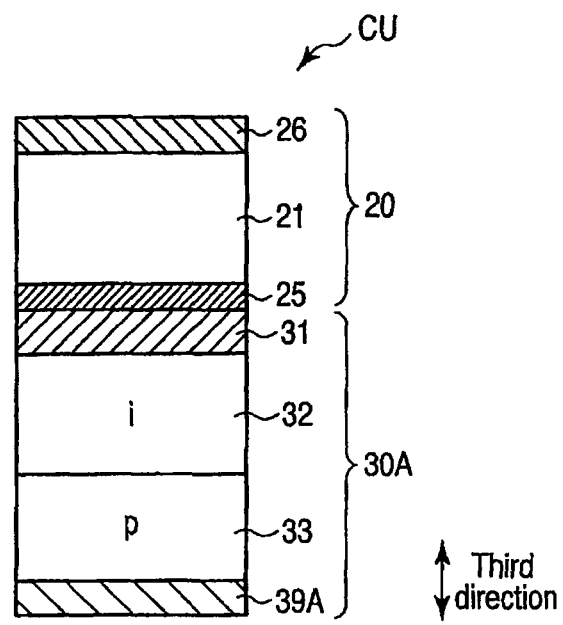
FIG. 12 is a diagram showing an example of the cell unit.

As shown in FIG. 12, the components (films) constituting the pim diode 30A may be stacked in reverse order from the order shown in FIG. 8 and FIG. 9.

That is, as shown in FIG. 12, the p-type layer 33 is provided on the conductive layer 39A. The i-type layer 32 is provided on the p-type layer 33. The metal layer 31 is provided on the i-type layer 32. The conductive layer 39A is provided on a interconnect line.

Figure 13:
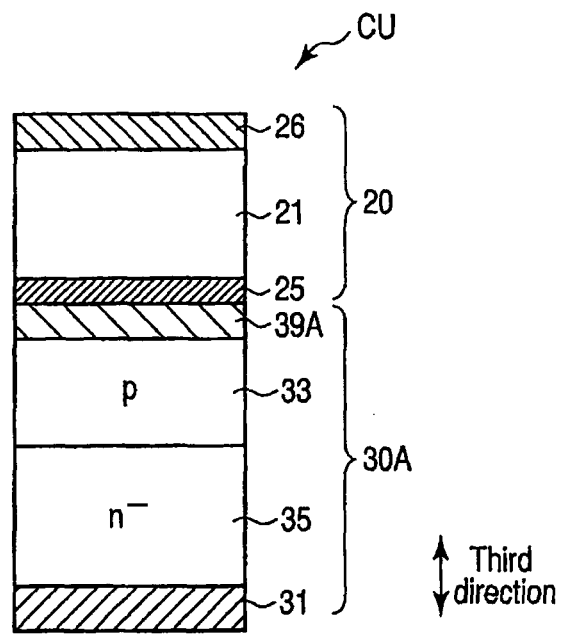
FIG. 13 is a diagram showing the example of the cell unit.

As shown in FIG. 13, an n-type semiconductor layer 35 low in impurity concentration may be used instead of the i-type layer. The n-type semiconductor layer 35 low in impurity concentration is hereinafter referred to as a low-concentration n-type layer 35. The donor impurity concentration of the low-concentration n-type layer 35 is, for example, about $1 \times 10^{17}/cm^3$ to $1 \times 10^{19}/cm^3$.

The low-concentration n-type layer 35 is an Si layer to which, for example, phosphorus (P) or arsenic (As) is added as an impurity (donor). In addition, the low-concentration n-type layer 35 may be a semiconductor layer such as an SiGe layer containing Si as the main component or a compound semiconductor layer as long as the low-concentration n-type layer 35 is an n-type semiconductor layer. However, the p-type layer 33 and the low-concentration n-type layer 35 preferably contain the same material as the main component.

Figure 14:
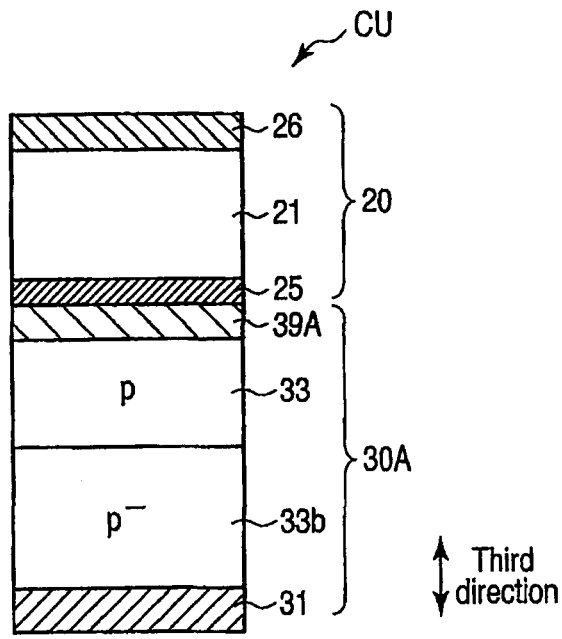
FIG. 14 is a diagram showing the example of the cell unit.

As shown in FIG. 14, a p-type semiconductor layer 33b low in impurity concentration may be used instead of the i-type layer or the n-type layer. Here, the p-type semiconductor layer 33b low in impurity concentration is referred to as a low-concentration p-type layer 33b. The low-concentration p-type layer 33b is provided between a p-type layer 33a and a metal layer 31b. The acceptor impurity concentration of the low-concentration p-type layer 33b is, for example, about $1\times10^{17}/cm^3$ to $1\times10^{19}/cm^3$.

In addition, the low-concentration p-type layer 33b may be a semiconductor layer such as an SiGe layer containing Si as the main component or a compound semiconductor layer as long as the low-concentration p-type layer 33b is a p-type semiconductor layer. However, the p-type layer 33 and the low-concentration p-type layer 33b preferably contain the same material as the main component in terms of the simplification of a manufacturing process and the consistency of materials.

Figure 15A:
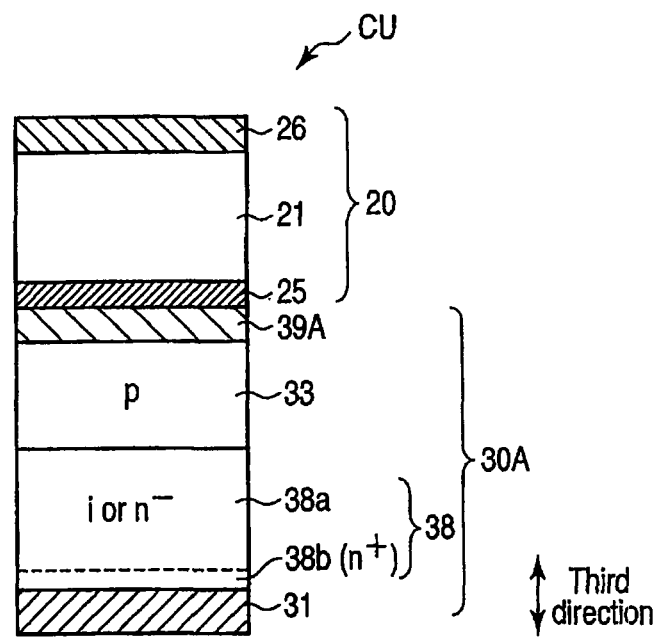
FIG. 15A is a diagram showing the example of the cell unit.

As shown in FIG. 15A, a semiconductor layer 38 that forms a junction with the metal layer 31 may have an unevenly distributed layer 38b.

The unevenly distributed layer 38b is formed between a region low in impurity concentration (hereinafter referred to as a low-concentration region) such as the i-type layer or the low-concentration n-type layer, and a metal layer 31.

For example, the unevenly distributed layer 38b is a layer in which an impurity (e.g., As or P) is unevenly distributed (segregated) with a concentration ($1\times10^{18}/cm^3$ or more, $1\times10^{20}/cm^3$ or less) higher than the concentration of the i-type layer or low-concentration impurity in a small region of, for example, about 0.5 nm to 10 nm in the vicinity of the interface between an i-type layer 38a and the metal layer 31.

Figure 15B:
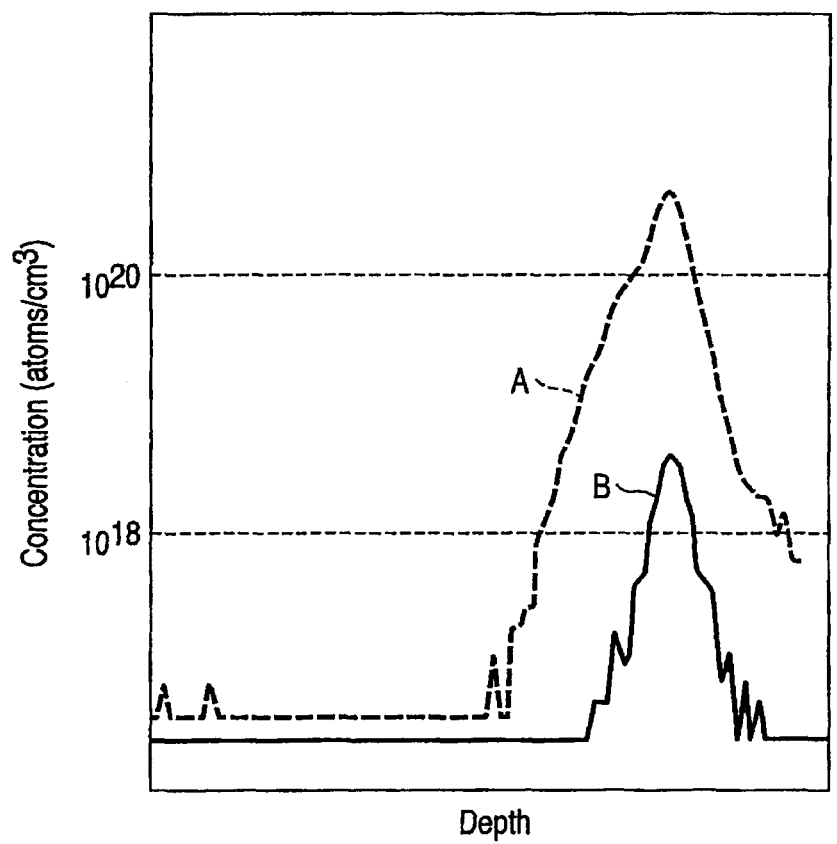
FIG. 15B is a diagram illustrating the distribution of the impurity concentration of an unevenly distributed layer.

Here, the difference between the n-type layer of the pin diode and the unevenly distributed layer of the pim diode 30A is described with reference to FIG. 15B. FIG. 15B shows the impurity concentrations of the n-type layer of the pin diode and the unevenly distributed layer of the pim diode 30A measured by a secondary ion mass spectroscopy (SIMS). In FIG. 15B, the horizontal axis of the graph indicates the depth from the surface of the element, and the vertical axis of the graph indicates the impurity concentrations. In addition, the horizontal axis in FIG. 15B is adjusted so that the peak positions of the impurity concentrations coincide for convenience of explanation.

In FIG. 15B, a distribution "A" corresponds to the impurity concentration distribution of the n-type layer of the pin diode, and a distribution "B" corresponds to the impurity concentration distribution of the unevenly distributed layer of the pim diode.

As apparent from a comparison between the distribution "A" and the distribution "B" in FIG. 15B, the maximum values of the impurity concentrations of the n-type layer and the unevenly distributed layer are different.

While the maximum value of the impurity concentration of the distribution "A" (n-type layer) is $1\times10^{20}$ cm$^{-3}$ or more, the maximum value of the impurity concentration of the distribution "B" (unevenly distributed layer) is $1\times10^{18}$ cm$^{-3}$ or more. That is, the maximum value of the impurity concentration of the distribution "B" ranges between $1\times10^{18}$ cm$^{-3}$ or more and $1\times10^{20}$ cm$^{-3}$ or less.

The unevenly distributed layer 38b has the impurity concentration and the thickness to be able to deplete an interface between the metal layer 31 and the i-type layer 38a.

Moreover, the distribution width of the impurity concentration of the distribution "B" is smaller than the distribution width of the impurity concentration of the distribution "A". That is, the width (dimension in a depth direction) of the unevenly distributed layer of the pim diode 30A can be said to be smaller than the width of the n-type layer of the pin diode.

It is obvious from the difference of the distributions that the unevenly distributed layer 38b is different from the n-type layer of the pin diode in which impurity is not unevenly distributed in the vicinity of the interface between the i-type layer 38a and the metal layer 31. The unevenly distributed layer 38b has a function of facilitating the supply of electrons from the metal layer 31 which is the supply source of the electrons. That is, the main function of the unevenly distributed layer 38b is not to supply electrons but to effectively reduce the interface resistance of the metal layer 31. Moreover, the unevenly distributed layer 38b is made of an impurity element that can be unevenly distributed, such as As or P, and is formed by the accumulation of the impurity at the interface of the metal layer 31.

On the other hand, the N-type layer of the pin diode supplies electrons and does not effectively reduce the resistance of the interface with the electrode.

The unevenly distributed layer 38b is unevenly distributed at the interface of the metal layer 31 (the interface is easily stabilized in terms of energy, and the impurity is accumulated in a more activated state and with a higher concentration than silicon in crystal). On the other hand, the n-type layer of the pin diode is not unevenly distributed in the vicinity of the interface of the metal layer 31, and the effect of the n-type layer that reduces the interface resistance of the metal layer 31 is less than when the unevenly distributed layer is provided.

As shown in FIG. 15A, the pim diode according to the present embodiment has the unevenly distributed layer 38b, so that the output current (forward current) of the diode during the application of the forward bias is higher.

The unevenly distributed layer 38b is formed by the impurity unevenly distributed at the interface between i-type layer 38a and the metal layer 31. Therefore, the impurity is not easily diffused in the i-type layer 38a, and the height (thickness) of the i-type layer 38a can be greater.

Furthermore, the electrons supplied into the diode are provided from the metal layer 31. Therefore, the unevenly distributed layer 38b may not have the electron supplying function. That is, if the unevenly distributed layer 38b has the function of reducing the interface resistance between the i-type layer 38a and the metal layer 31, the forward current of the diode can be higher.

Furthermore, the unevenly distributed layer 38b having an impurity concentration of $1\times10^{20}$ cm$^{-3}$ or less is provided in the i-type layer 32 adjacently to the metal layer 31, such that the on-current in the pim diode 30A can be higher during reverse bias application. Thus, the pim diode 30A according to the present embodiment provides output characteristics suitable for the memory element for the bipolar operation. In addition, the pim diode 30A according to the present embodiment can output a high reverse current (on-current) by the application of a reverse bias equal to or more than the threshold even without the unevenly distributed layer 38b.

The segregated impurity may be an impurity serving as a donor for the i-type layer or an impurity serving as an acceptor for the i-type layer.

Thus, the unevenly distributed layer 38b is formed at the interface between the metal layer 31 and the semiconductor layer (n-type layer or i-type layer) 38, such that the Schottky barrier $\phi_B$ between the metal layer and the semiconductor layer shown in FIG. 10A can be reduced. In addition, it is preferable that the unevenly distributed layer 38b be provided so that the Schottky barrier height between the metal layer 31 and the i-type layer 38 may be closer to effectively 0 eV.

When the pim diode 30A has the p-type layer 33, the junction of the metal layer 31 and the semiconductor layer 38 that has the unevenly distributed layer 38b comes closer to an ohmic junction from the Schottky junction. The reason is that the Fermi level in the vicinity of the interface of the semiconductor layer 38 is affected by the Fermi level and impurity concentration of the unevenly distributed layer 38b, so that the Fermi level in the vicinity of the interface is higher than the Fermi level "Efi" of the i-type layer 32, resulting in an increased concentration of the electrons in the vicinity of the interface and an effective reduction in the Schottky barrier of the junction between the metal layer and the semiconductor layer.

Furthermore, from the viewpoint of the ratio (on/off ratio) between an on-current and an off-current, the number of carriers conducted between two semiconductor layers 33, 38 can be increased by providing the unevenly distributed layer 38b. It is preferable that an unevenly distributed layer of an inverse conductivity type to that of the p-type layer 33 in the pim diode including the i-type layer 38 that has the unevenly distributed layer 38b and the p-type layer 33 (or an n-type layer 43 described later).

Thus, the inhibition of the movement of the electrons injected to the semiconductor layer (e.g., the i-type layer) from the metal layer due to the Schottky barrier $\phi_B$ is reduced when a forward bias is applied to the pim diode 30A.

Consequently, the forward current in the pim diode 30A can be increased when a forward bias is applied to the pim diode 30A used in the resistance change memory according to the present embodiment.

In addition, a low-concentration p-type layer having an unevenly distributed layer in which an acceptor impurity is segregated may be used for the semiconductor layer between the p-type layer 33 and the conductive layer 39A.

Figure 16:
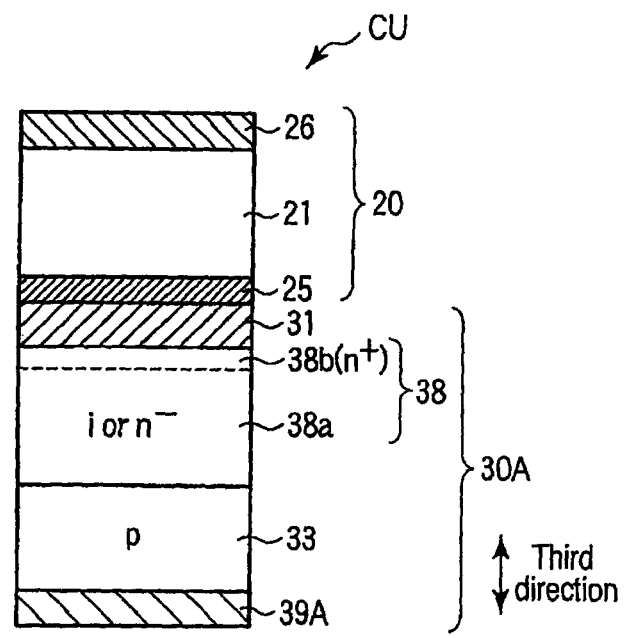
FIG. 16 is a diagram showing the example of the cell unit.

As shown in FIG. 16, the layers constituting the pim diode may be stacked in reverse order from that in the configuration of the pim diode shown in FIG. 15A.

In the pim diode 30A shown in FIG. 16, the components are stacked in the following order from the lower side (substrate side): the conductive layer 39A, the p-type layer 33, the i-type layer 38 (or an n-type layer) that has the unevenly distributed layer 38b, and the metal layer 31. In this case, the unevenly distributed layer 38b is positioned in the upper part of the low-concentration region 38a and is in contact with the upper metal layer 31 of the pim diode 30A.

In the pim diode 30A shown in FIG. 16, the Schottky barrier $\phi_B$ between the metal layer 31 and the i-type layer 38 can be reduced, and the forward current in the pim diode 30A can be increased, as in the diode shown in FIG. 15A.

Figure 17:
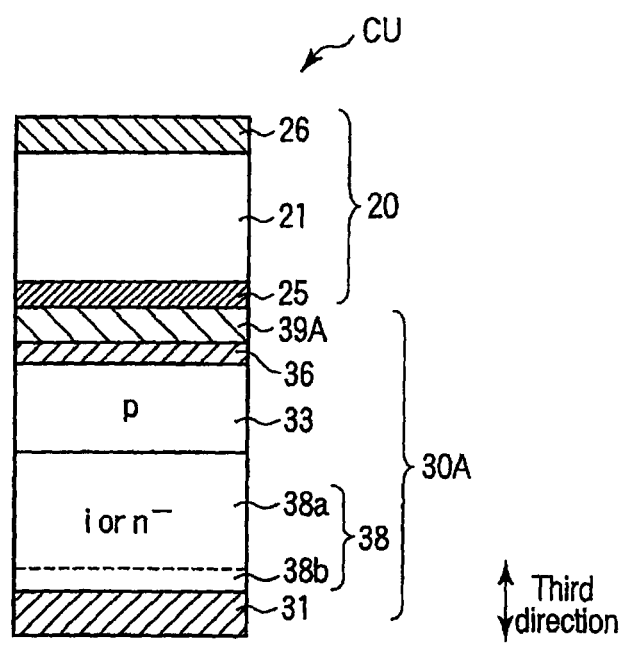
FIG. 17 is a diagram showing the example of the cell unit.

As shown in FIG. 17, a silicide layer 36 may be provided between the conductive layer 39A and the p-type layer 33. In this case, a metal compound such as TiN is used for the conductive layer 39A. The silicide layer 36 is provided between the p-type layer 33 and the conductive layer 39A made of the metal compound, so that resistance (interface resistance) generated at the interface between the p-type layer 33 and the conductive layer 39A can be reduced. However, it goes without saying that the conductive layer 39A may be a silicide layer in the configuration shown in FIG. 8 and FIG. 9, and FIG. 12 to FIG. 16.

In addition, the memory element 20 and the pim diode 30A may be stacked in reverse order in each of the cell units shown in FIG. 8 and FIG. 9, and FIG. 12 to FIG. 17.

Figures 18, 19A:
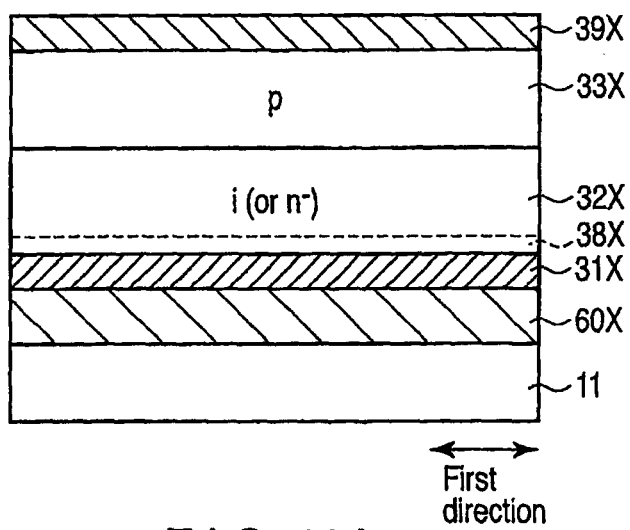
FIG. 18 is a table showing the effective work functions of conductors.
FIG. 19A is a diagram showing one step of a method of manufacturing the resistance change memory according to the embodiment.

Here, the material used for the metal layer 31 that constitutes the pim diode 30A as the non-ohmic element is described with FIG. 18.

FIG. 18 shows the effective work functions of the materials used for the metal layer 31 that constitutes the non-ohmic element. Regarding the effective work function and the Fermi level, the effective work function is lower when the Fermi level is higher, and the effective work function is higher when the Fermi level is lower.

In the pim diode 30A used in the resistance change memory according to the present embodiment, the metal layer 31 which is the component of this diode is used as a cathode layer, and the metal layer 31 is therefore preferably made of a material having a low work function. That is, it is preferable that the Fermi level of the metal layer 31 be located in the vicinity of the conduction band of the i-type layer and equal to or more than the Fermi level of the n-type semiconductor layer (e.g., n-type Si).

For example, when silicon (Si) is used in the p-type layer 33 and the i-type layer 32, a material having a work function of about 3.5 eV to 4.7 eV is used for the metal layer 31.

In this case, in the example shown in FIG. 18, a material selected from the group consisting of the following materials is used for the metal layer 31 of the pim diode 30A: silicide such as $TiSi_x$, $TaSi_x$, $CoSi_x$, $NiSi_x$, $YSi_x$, $ErSi_x$ and $HfSi_x$, a conductive compound such as $TiC_x$, $TiB_x$, $TiN_x$, $TaB_x$, $TaC_x$, $TaN_x$, $TaN_x$, La, $LaB_x$, $LaN_x$, $HfSiN_x$ and ZrC, and a metal such as Hf (here, x>0).

However, it goes without saying that a conductor other than the materials taken here as examples may be used for the metal layer that constitutes the pim diode.

Thus, the height $\phi_B$ of the Schottky barrier created between the semiconductor layer (the i-type layer or low-concentration n-type layer) and the metal layer can be smaller. As a result, when a forward bias is applied to the pim diode 30A used in the resistance change memory according to the present embodiment, the inhibition of the movement of the electrons injected to the i-type layer from the metal layer due to the Schottky barrier is reduced.

Therefore, if a conductor having a low work function is used as the material for the metal layer, the forward current in the pim diode 30A can be increased.

As in the example described with FIG. 12 to FIG. 18, the unevenly distributed layer 38b is provided in the pim diode 30A or the work function of the material used for the metal layer 31 is adjusted, so that the electric properties of the pim diode 30A used in the resistance change memory according to the present embodiment can be improved.

(4) Manufacturing Method

A method of manufacturing the resistance change memory according to the present embodiment is described with FIG. 19A to FIG. 19F. In the example of the structure of a cell unit formed in the present manufacturing method, a memory element is stacked on a non-ohmic element. However, it goes without saying that the present manufacturing method is applicable to a structure in which a non-ohmic element is stacked on a memory element.

FIG. 19A shows the sectional structure of a memory cell array along a first direction in one step of the method of manufacturing the resistance change memory according to the present embodiment.

As shown in FIG. 19A, a conductive layer 60X as a interconnect line is deposited on a substrate (e.g., an interlayer insulating film) 11 by, for example, a chemical vapor deposition (CVD) method or a sputter method.

A plurality of layers for forming a non-ohmic element of the cell unit are sequentially deposited on the conductive layer 60X by, for example, the chemical vapor deposition (CVD) method or the sputter method. The non-ohmic element formed in the manufacturing method according to the present embodiment is a pim diode in which an intrinsic semiconductor layer is provided between a p-type semiconductor layer and a metal layer.

A metal layer 31x is deposited on the conductive layer 60X. The metal layer 31X is made of one selected from the group consisting of a metal, an alloy of two or more kinds of metal elements, a conductive metal compound, and a stack film of these materials.

A semiconductor layer 32 is deposited on the metal layer 31X. The semiconductor layer 32X is, for example, an i-type layer made of intrinsic-type silicon. The thickness of the semiconductor layer 32X is, for example, about 60 nm to 120 nm. The i-type layer 32X may be a semiconductor layer containing no impurity or may be a semiconductor layer containing a sufficiently low concentration of impurity (dopant) to serve as an acceptor or donor as compared with a semiconductor layer containing an impurity such as a p-type layer. In addition, instead of the i-type layer 32X, an n-type layer having a low impurity concentration (low-concentration n-type layer) may be formed on the metal layer 31X.

When an unevenly distributed layer 38X is formed at the interface between the i-type layer (or low-concentration n-type layer) 32X and the metal layer 31X, the unevenly distributed layer 38X is formed in the vicinity of the interface between the i-type layer 32X and the conductive layer 31X by, for example, ion implantation or the segregation effect of the impurity obtained by heating.

A semiconductor layer 33X is deposited on the i-type layer 32X. The semiconductor layer 33X is a p-type semiconductor layer (a p-type layer). For example, the p-type layer 33X is a silicon layer doped with boron (B), and has a thickness of about 3 nm to 15 nm. The p-type layer 33X may be doped with the impurity (acceptor) in situ when deposited or may be doped with the impurity (acceptor) by an ion implantation method after deposited.

A conductive layer 39X is deposited on the p-type layer 33X by, for example, the CVD method or a sputter method. The conductive layer 39X is made of one selected from the group consisting of a metal, an alloy, a metal compound, a silicide layer and a stack structure of these materials. When the semiconductor layer 33X is a silicon layer, the conductive layer 39X has a single-layer structure of the silicide layer or a stack structure of the silicide layer and the metal compound.

The silicide layer included in the conductive layer 39X is formed in the following process. A metal film (e.g., nickel (Ni) or titanium (Ti)) is deposited on the silicon layer as the p-type layer 33X. Then, the metal film and the silicon layer are subjected to a heat treatment, and the silicide layer 39X is formed on the p-type layer 33X by a chemical reaction (here, referred to as a silicide reaction) caused by the heating of the metal and silicon.

In addition to the above-described process, a heat treatment at, for example, about 500° C. to 800° C. may be carried out to crystallize the semiconductor layer. A rapid thermal annealing (RTA) method is used in the heat treatment for crystallization.

When the non-ohmic element of the resistance change memory is a pim diode, the Fermi level of the material for forming the metal layer is preferably located in the vicinity of the conductor of the i-type layer. When the i-type layer 32X and the p-type layer 33X are made of silicon, the material for forming the metal layer 31X has a work function of about 3.5 eV to 4.7 eV.

Figure 19B:
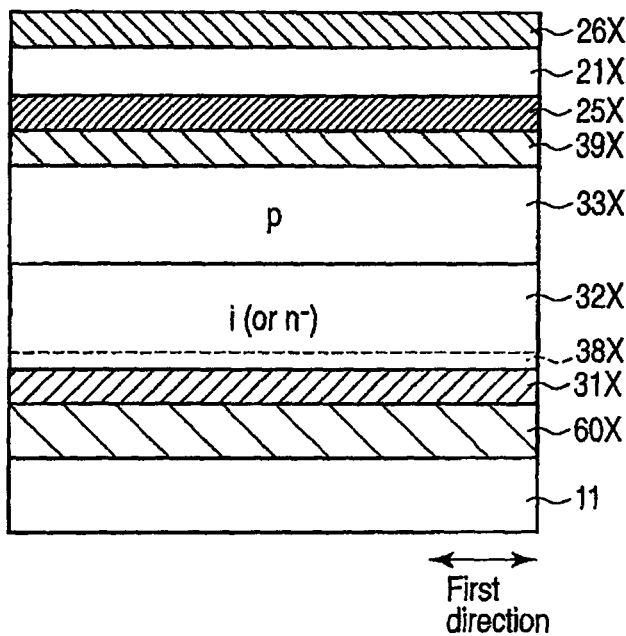
FIG. 19B is a diagram showing one step of the method of manufacturing the resistance change memory according to the embodiment.

FIG. 19B shows the sectional structure of a memory cell array along the first direction in one step of the method of manufacturing the resistance change memory according to the present embodiment.

As shown in FIG. 19B, a first electrode layer 25X, a resistance change film 21X and a second electrode layer 26X are sequentially deposited on a conductive layer 39X as constituent parts of the memory element.

The electrode layers 25X, 26X are formed by, for example, the CVD method or sputter method. The resistance change film 21X is formed by, for example, the sputter method, the CVD method, an atomic layer deposition (ALD) method, or a metal-organic CVD (MOCVD) method.

As described above, for example, a metal oxide, a metal compound or organic matter is used for the resistance change film 21X.

The material for the electrode layers 25X, 26X is not limited as long as the resistance change film 21X itself reversibly changes its resistance value due to externally provided energy (e.g., a voltage or heat) and retains the changed resistance value in a nonvolatile manner. However, when the reversible and nonvolatile change of the resistance value of the resistance change film 21X is obtained by a combination of the resistance change film 21X and the electrode layers, the materials for the electrode layers 25X, 26X and the resistance change film 21X are properly selected by the combination of materials whereby such characteristics are obtained.

A diffusion preventing layer or an adhesive layer may be separately provided between the electrode layer 25X and the conductive layer 39X. The electrode layer 25X and the conductive layer 39X may function as the diffusion preventing layer and the adhesive layer.

In the steps shown in FIG. 19A and FIG. 19B, without removing the metal film which has not caused a silicide reaction with the silicon layer, the metal film may be used as the bottom-side electrode layer of the memory element. For example, a silicide layer 39X is formed between the p-type layer 33X and the metal film by a silicide reaction between the p-type silicon layer 33X and the metal film. Then, without removing the metal film which has not caused a silicide reaction, the resistance change film 21X and the second electrode layer 26X are sequentially deposited on the metal film as a component of the memory element. As a result, the metal film which has not caused a silicide reaction can be used as the lower electrode layer of the memory element, and the process of manufacturing the resistance change memory can be simplified.

Figure 19C:
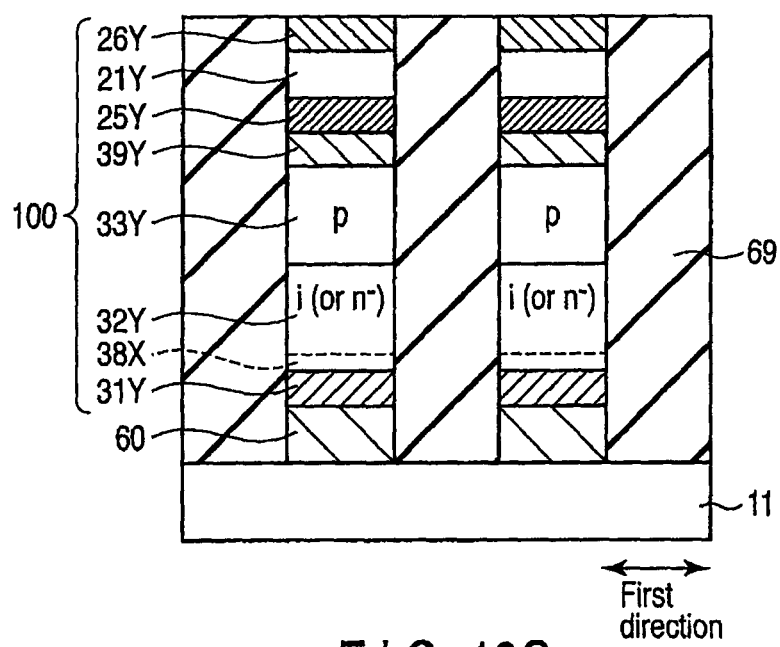
FIG. 19C is a diagram showing one step of the method of manufacturing the resistance change memory according to the embodiment.

FIG. 19C shows the sectional structure of a memory cell array along the first direction in one step of the method of manufacturing the resistance change memory according to the present embodiment.

In the process shown in FIG. 19C, a mask (not shown) having a predetermined shape is formed on an electrode layer 26Y. The mask is made of, for example, tungsten (W). Then, the layers under the mask are sequentially processed by etching that uses a photolithographic method and a reactive ion etching (RIE) method.

In accordance with the shape of the mask, electrode layer 25Y, 26Y, a resistance change film 21Y, a silicide layer 39Y, a p-type layer 33Y, an i-type layer 32Y and a metal layer 31Y are formed. Thus, a plurality of stacks 100 are formed on the substrate 11. The stacks 100 are divided from one other in the first direction into cell units at predetermined intervals, and a gap is formed between two stacks 100 adjacent in the first direction. The formed stacks 100 extend in the second direction.

Simultaneously with the processing and formation of the stacks 100, the conductive layer on the substrate 11 is processed, and a interconnect line 60 extending in the second direction is formed on the substrate 11. Then, an interlayer insulating film 69 is embedded into the gap between the stacks 100 adjacent in the first direction by, for example, the CVD method or a coating method.

When the mask is made of a metal, the mask may remain on the electrode layer 26Y without being detached.

In this step, the stacks 100 may be further divided in the second direction to form cell units, and a interconnect line extending in the first direction may be formed on the cell units to form the memory cell array M1 shown in FIG. 2. However, in a cross-point type memory cell array, it is preferable from the viewpoint of the simplification of the manufacturing process, to form the cell units and the memory cell arrays by the following steps shown in FIG. 19D to FIG. 19F without dividing the stacks 100 in the second direction to form the cell units (memory cell arrays) immediately after the step shown in FIG. 19C.

Figure 19D:
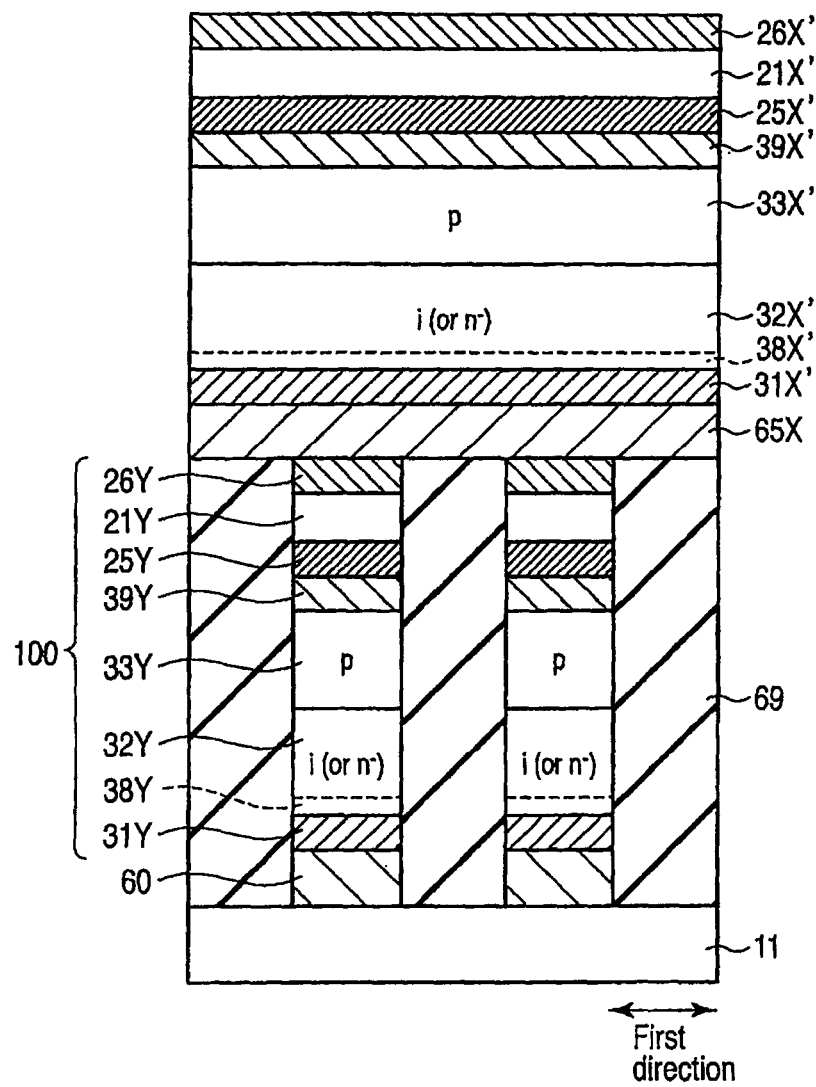
FIG. 19D is a diagram showing one step of the method of manufacturing the resistance change memory according to the embodiment.
Figure 19E:
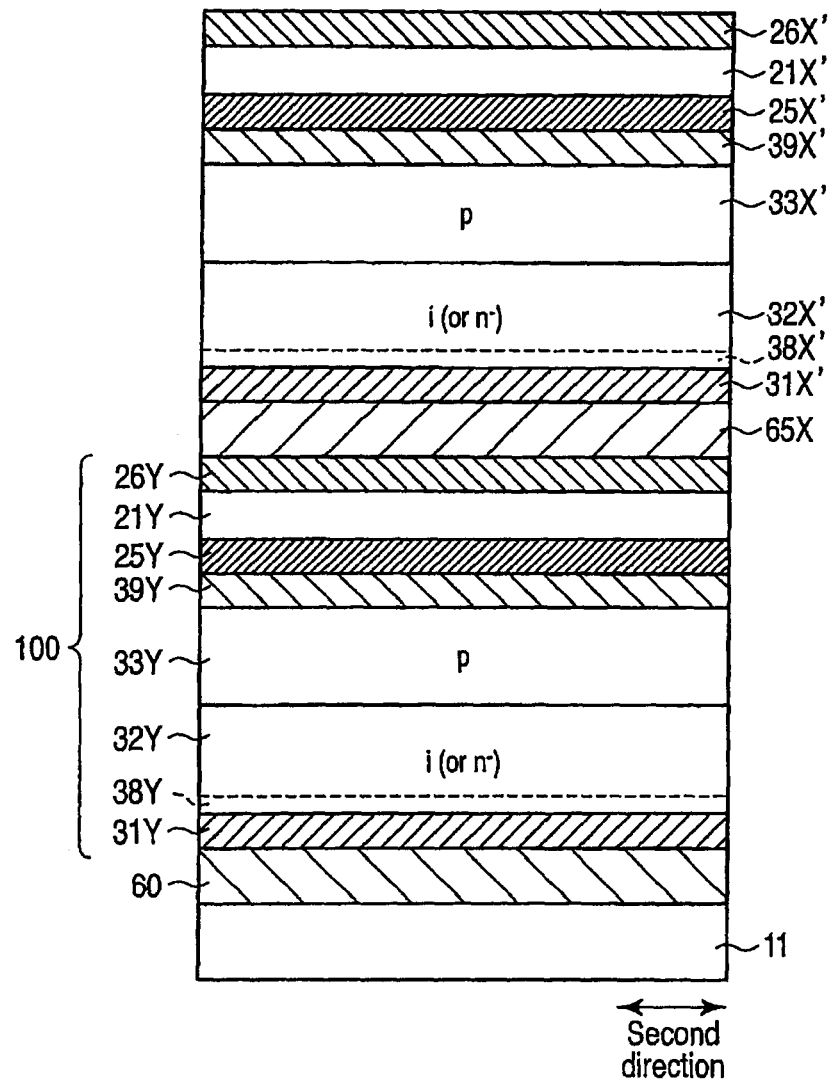
FIG. 19E is a diagram showing one step of the method of manufacturing the resistance change memory according to the embodiment.

FIG. 19D shows the sectional structure of a memory cell array along the first direction in one step of the method of manufacturing the resistance change memory according to the present embodiment. FIG. 19E shows the sectional structure of the memory cell array along the second direction in one step of the method of manufacturing the resistance change memory according to the present embodiment.

As shown in FIG. 19D and FIG. 19E, a conductive layer 65X as a second interconnect line is deposited on the stack 100 and an interlayer insulating film 69 extending in the second direction. Then, layers to constitute the cell unit of a second memory cell array are sequentially deposited on the conductive layer 65X.

The stacking order of the layers deposited on the conductive layer 65X varies depending on which of the connection relations indicated by "a" to "p" of FIG. 4 two cell units stacked with one interconnect line (conductive layer 65X) in between have.

For ease of explanation, the two cell units have the connection relation indicated by "a" of FIG. 4 in the case described here. That is, in the example shown in FIG. 19D and FIG. 19E, the stacking order of layers 35X', 31X', 32X', 33X', 36X', 25X', 21X', 26X' on the conductive layer 65X is the same as the stacking order of the layers constituting the stack 100. The layers stacked on the conductive layer 65X are formed in the same manufacturing process as the layers constituting the stack 100.

Figure 19F:
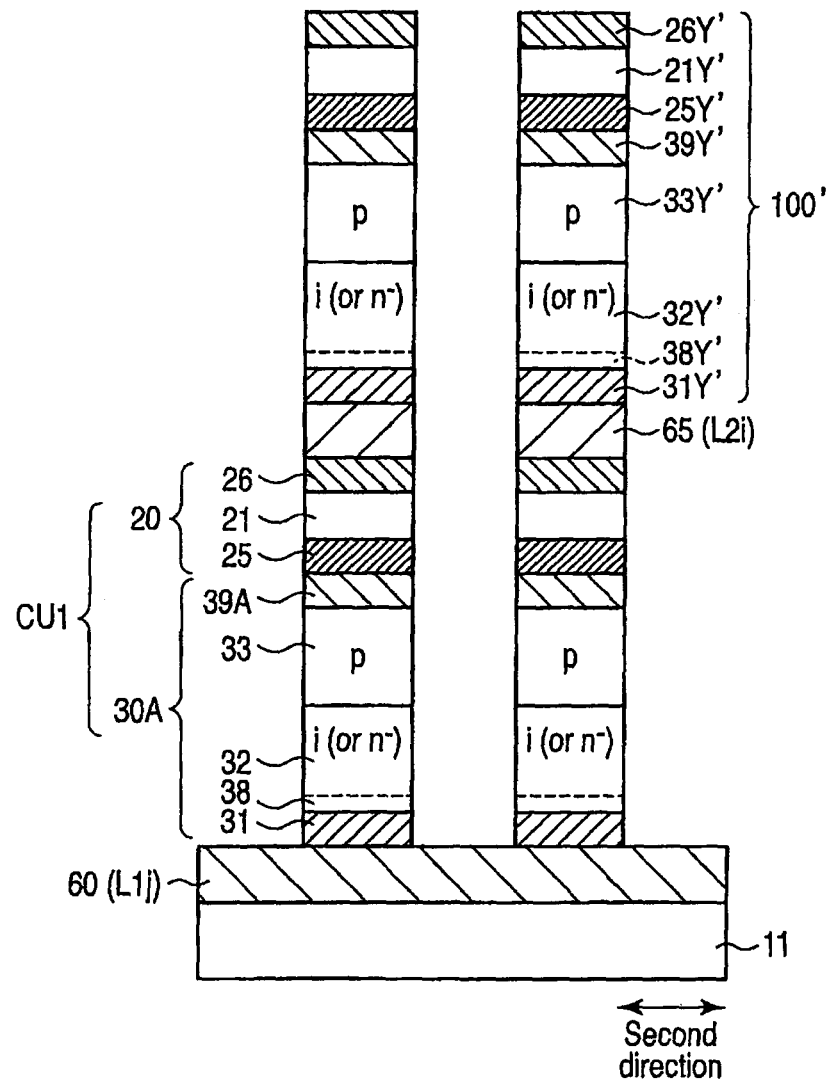
FIG. 19F is a diagram showing one step of the method of manufacturing the resistance change memory according to the embodiment.

FIG. 19F shows the sectional structure of a memory cell array along the second direction in one step of the method of manufacturing the resistance change memory according to the present embodiment.

The layers 26X', 21X', 25X', 36X', 33X', 32X', 31X', 35X', 65X and the underlying stack 100 shown in FIG. 19D and FIG. 19E are processed by the photolithographic technique and the RIE method in such a manner as to ensure the etching selectivity for the interconnect line 60.

In this step, the layers 26X', 21X', 25X', 36X', 33X', 32X', 31X', 35X', 65X and the stack extending in the second direction are divided in the second direction.

Thus, as shown in FIG. 19F, a interconnect line 65 (L2$i$) extending in the first direction is formed, and a cell unit CU1 is formed between the interconnect line 65 (L2$i$) and the interconnect line 60 (L1$j$) extending in the second direction. One of the first and second interconnect lines 60, 65 is used as a bit line, and the other is used as a word line.

In the cell unit CU1, a pim diode 30A as a non-ohmic element is formed on the interconnect line 60. As described above, the pim diode 30A has a stack structure composed of a metal layer 31, an i-type layer 32 and a p-type layer 33. On a conductive layer 39A of the pim diode 30A, a memory element 20 is formed.

Moreover, since the layers are etched starting from the top in order, a stack 100' is formed on the cell unit CU1 with the interconnect line 65 in between. The stacks 100' are divided in the second direction.

In the step shown in FIG. 19F, the sectional structure of the cell unit CU1 along the first direction is the same as the sectional structure shown in FIG. 19D, and the stack 100' extends in the first direction.

Interlayer insulating films are embedded into the gap between the cell units CU1 adjacent in the second direction and into the gap between the stacks 100' adjacent in the second direction, respectively.

In the cross-point type memory cell array, after the step shown in FIG. 19F, the stack 100' is processed in its first direction into the cell unit CU2 of the upper (second-layer) memory cell array M2 on the first-layer memory cell array M1 in FIG. 2.

When memory cell arrays are further provided on the stacks 100', the process similar to the process shown in FIG. 19D to FIG. 19F is repeated before a predetermined number of memory cell arrays are stacked.

Amorphous silicon may be crystallized into polysilicon by one heat treatment after a predetermined number of stacked memory cell arrays are formed rather than by heat treatments for the respective layers (memory cell arrays).

As shown in FIG. 19D to FIG. 19F, the first-layer memory cell array and the second-layer memory cell array are simultaneously processed on the substrate 11.

Thus, the processing to form the upper memory cell array and the processing to form the lower memory cell array are carried out in the common step, so that the process of manufacturing the resistance change memory having the cross-point type memory cell array shown in FIG. 2 is simpler and its manufacturing costs are lower than when each memory cell array in each layer (each interconnect level) is processed in the first and second directions.

The resistance change memory according to the present embodiment that includes the cross-point type memory cell array and the cell unit shown in FIG. 2 and FIG. 3 is manufactured by the process described above.

The non-ohmic element (pim diode) that has the preferable forward bias characteristics/reverse bias characteristics for the resistance change memory using the memory element having the unipolar or bipolar operation can be formed by the manufacturing method according to the present embodiment.

In the method of manufacturing the resistance change memory according to the present embodiment, the formed non-ohmic element is a pim diode including the metal layer, the i-type layer and the p-type layer. The pim diode 30A according to the present embodiment has a structure in which the metal layer 31 and two semiconductor layers are stacked on the interconnect line 60.

When a pin diode is used for the cell unit of the resistance change memory, the pin diode has a structure in which a metal layer (conductive layer) and three semiconductor layers are stacked on the interconnect line 60.

Thus, in the pim diode 30A according to the present embodiment, the dimension of the non-ohmic element in the third direction (stacking direction of the layers) can be reduced by the thickness of one semiconductor layer, as compared with the pin diode. That is, in the pim diode of the resistance change memory according to the present embodiment, the thickness (height) of the non-ohmic element that constitutes the cell unit can be reduced.

Consequently, during the processing to form the cell unit, for example, as in the step shown in FIG. 19C, the aspect ratio of the gap between adjacent stacks (cell units) can be reduced, and the processing of the stacks is less restricted by the aspect ratio.

Such a reduction in the aspect ratio is more effective because processing is carried out for the thickness of two memory cell arrays when the resistance change memory having the cross-point type memory cell array is formed by a manufacturing method that forms the two stacks CU1, 100' at the same time, as in the steps shown in FIG. 19D to FIG. 19F.

Moreover, the pim diode 30A according to the present embodiment is also effective when the cell size of the cell unit is 30 nm or less.

Accordingly, in the resistance change memory according to the present embodiment, there is no need to increase the dimension in a direction (first direction or second direction) level with the surface of the substrate in order to inhibit the aspect ratio from being increased due to the thickness of the non-ohmic element. Therefore, in the resistance change memory according to the present embodiment, the area of a chip occupied by one cell unit can be reduced, and the storage density of the cross-point type memory cell array can be improved.

Furthermore, as in the resistance change memory according to the present embodiment, the pim diode 30A and the cell unit that includes this diode can be reduced in thickness, so that the quality of embedding the interlayer insulating film 69 into the gap between adjacent stacks as in the steps shown in FIG. 19D and FIG. 19F is improved.

When the aspect ratio of the gap (stack) is high, the dimension of the lower layer in the direction (first direction or second direction) level with the surface of the substrate tends to be greater than the dimension of the upper layer in the first or second direction. Therefore, in the manufacturing method in which the two stacks (cell units) CU1, 100' are formed at the same time as in the steps shown in FIG. 19D to FIG. 19F, the lower cell unit and the upper cell unit may be different in size in the first or second direction due to the high aspect ratio, and the electric properties of the elements that constitute the cell unit may vary. However, in the resistance change memory according to the present embodiment, the aspect ratio between the cell units can be reduced, which makes it possible to inhibit the electric properties of the formed non-ohmic element and memory element from varying due to the high aspect ratio.

As described above, according to the resistance change memory manufacturing method in the first embodiment, it is possible to provide a resistance change memory which has the high characteristics of the non-ohmic element and which enables the reduction of the thickness of the non-ohmic element.

(5) Effects

In the resistance change memory according to the first embodiment, the non-ohmic element 30A included in the cell unit in the cross-point type memory cell array is a pim diode including a p-type semiconductor layer (p-type layer), an intrinsic semiconductor layer (i-type layer) and a metal layer, as shown in FIG. 8 and FIG. 9.

When the pim diode 30A is used as the non-ohmic element (rectification element) of the resistance change memory, its thickness can be reduced with rectification properties maintained as shown in FIGS. 11A and 11B.

For example, in comparison with the pin diode, the pim diode 30A according to the present embodiment is capable of substantially the same operation as that of the pin diode even without the n-type semiconductor layer, as has been described with FIG. 10A to FIG. 11B.

Moreover, the pim diode 30A is applicable not only to the memory element for the unipolar operation but also to the memory element for the bipolar operation.

In the example shown in FIG. 11A, the upper limit value of the forward current of the pim diode according to the present embodiment is at about the same level with the upper limit value of the forward current of the pin diode. Moreover, during reverse bias application, the reverse current in the off-state of the pim diode according to the present embodiment is about two digits lower than the reverse current of the pin diode.

Furthermore, the pim diode 30A used in the resistance change memory according to the present embodiment is provided with the unevenly distributed layer having an impurity concentration of $1\times10^{18}$ cm$^{-3}$ and more and $1\times10^{20}$ cm$^{-3}$ or more. Thus, a current that changes the resistance state of the memory element for the bipolar operation can be output in the on-state of the pim diode 30A during reverse bias application.

Therefore, according to the pim diode used in the resistance change memory in the present embodiment, preferable electric properties for the resistance change memory can be obtained.

As described above, the pin diode as the comparative example has a structure in which an intrinsic semiconductor layer is held between a p-type semiconductor layer and an n-type semiconductor layer, and separately includes electrode layers respectively connected to the p-type semiconductor layer and the n-type semiconductor layer. The case where the memory element having unipolar operation is used for the resistance change memory, in order to enable the set/reset operation, the reverse current (off current) of the pin diode to which a reverse bias is applied during the set/reset operation is preferably suppressed. To this end, the dimension (thickness) of the pin diode including the electrode layer in the third direction is set at a value of about 100 nm. In this dimension, the thickness of the n-type layer of the pin diode accounts for about 5 to 15 nm.

Furthermore, the pin diode as the comparative example is not easily applied to the memory element for the bipolar operation. The reason is that the pin diode does not allow a high reverse current (on-current) to run during reverse bias application.

In the pim diode 30A according to the present embodiment, electrons are supplied to the i-type layer 32 from the metal layer 31 without the n-type semiconductor layer provided between the i-type layer 32 and the metal layer 31. Moreover, in the pim diode 30A according to the present embodiment, the metal layer 31 is used as the electrode layer of the diode 30A, so that there is no need to separately provide an electrode layer. Therefore, the pim diode according to the present embodiment can be smaller in thickness than the pin diode.

Furthermore, when the diffusion of the impurity of the semiconductor layer and the depletion of the semiconductor layer are taken into consideration, the impurity diffusion region and the depletion in the p-type layer of the pim diode have only to be taken into consideration because one of the two terminals (cathode/anode) of the pim diode according to the present embodiment is a metal layer. That is, the metal layer of the pim diode 30A according to the present embodiment can be reduced in thickness with no need to consider the impurity diffusion and the depletion.

Thus, the pim diode 30A used in the resistance change memory according to the present embodiment can have substantially the same characteristics as the pin diode even without the n-type layer, and can be smaller in thickness than the pin diode.

Along with the progress in the shrinking of the element, the number of impurities (impurity concentration) included in each semiconductor layer more greatly fluctuates. Thus, in the diode (e.g., the pin diode) that includes two n-type and p-type semiconductor layers, the characteristics of each element more greatly varies due to the fluctuation in the number of impurities.

In contrast, in the pim diode according to the present embodiment, the semiconductor layer including an impurity as a dopant is mainly the p-type layer alone. Therefore, in the case of the pim diode according to the present embodiment, variation of the electric properties of the non-ohmic element (pim diode) caused by the number of impurities included in the semiconductor layer can be inhibited. As a result, the characteristics of the non-ohmic element of the resistance change memory can be improved.

From the viewpoint of the process of the resistance change memory, the thickness (height) of the diode can be reduced, so that the increase of the aspect ratio of the distance (gap) between the cell units adjacent in the first or second direction in the memory cell array can be inhibited, and the memory cell array and cell unit can be more easily processed.

Furthermore, the use of the pim diode 30A makes it possible to reduce the distance between the cell units without increase of the aspect ratio. Thus, in the resistance change memory according to the present embodiment, the number of cell units for a predetermined chip area can be increased, and the storage density of the memory cell array can be increased.

Furthermore, the thickness of the depletion layer is adjusted by an impurity concentration of the p-type layer 33 included in the pim diode 30A is lower within about $10^{19}/cm^3$ to $10^{22}/cm^3$. As a result, when the thickness (height) of the diode is more reduced, the reverse current (on-current) in FIG. 11 can be kept.

As described above, according to the first embodiment, the high characteristics of the non-ohmic element for the resistance change memory are obtained, and the thickness of the non-ohmic element can be reduced.

<2> Second Embodiment

A resistance change memory according to a second embodiment is described with FIG. 20 to FIG. 26. It is to be noted that components equivalent to the components described in the first embodiment are provided with the same reference numbers and are described when necessary.

(1) Basic Example

A basic example of the resistance change memory according to the second embodiment is described with FIG. 20 and FIG. 21.

FIG. 20 is a bird's-eye view of the basic example of the cell unit used in the resistance change memory according to the second embodiment. FIG. 21 is a diagram showing the sectional structure of the cell unit of this basic example.

As shown in FIG. 20 and FIG. 21, in a non-ohmic element 40A used in the resistance change memory according to the present embodiment, an n-type semiconductor layer 43 (hereinafter referred to as an n-type layer) is used instead of the p-type layer of the pim diode.

In the non-ohmic element 40A according to the present embodiment, an i-type layer 42 is provided between the n-type layer 43 and a metal layer 41. A diode having a structure in which the i-type layer 42 is held between the n-type layer 43 and the metal layer 41 as described above is hereinafter referred to as a nim diode 40A.

The nim diode 40A according to the present embodiment is different from the pim diode described in the first embodiment in that the n-type layer 43 made of a semiconductor is used as a cathode layer and that the metal layer 41 made of a conductor is used as an anode layer.

Thus, when a forward bias is applied to the nim diode 40A, a negative potential is applied to the n-type layer 43, and a positive potential is applied to the metal layer 41. On the contrary, when a reverse bias is applied to the nim diode 40A, a positive potential is applied to the n-type layer 43, and a negative potential is applied to the metal layer 41.

The n-type layer has a donor impurity concentration of, for example, about $10^{21}/cm^3$. The thickness of the n-type layer 43 is, for example, about 5 nm to 15 nm. The n-type layer 43 is, for example, a silicon layer containing phosphorus (P) or arsenic (As) as a donor impurity. In addition, a conductive layer 49A as an electrode is provided on the n-type layer 43.

In the nim diode, the metal layer 41 is preferably a conductor highly capable of injecting holes into a semiconductor. Therefore, the material used for the metal layer 41 in the nim diode 40A is preferably a conductor (e.g., a metal, metal compound or alloy) having a high work function.

Furthermore, the Fermi level of the material used for the metal layer 41 that constitutes the nim diode 40A is preferably located on the valence band side of the i-type layer and equal to or less than the Fermi level of the p-type semiconductor layer (e.g., p-type Si). If such a conductor is used for the metal layer 41 of the nim diode 40A, the height of the Schottky barrier for the holes generated between the metal layer 41 and the i-type layer 42 can be reduced.

Thus, the inhibition of the movement of the holes between the metal layer 41 and the i-type layer 42 due to the Schottky barrier can be suppressed.

The operation mechanism of the nim diode 40A according to the present embodiment is only different from that of the pim diode 30A according to the first embodiment in that the source of supply of electrons to the nim diode 40A is the n-type layer 43 and that the source of supply of holes to the nim diode 40A is the metal layer 41. The substantial operation mechanism according to the present embodiment is the same as that in the first embodiment. Thus, the operation of the nim diode 40A is not specifically described in the second embodiment.

Furthermore, the method of manufacturing the resistance change memory according to the present embodiment that uses the nim diode 40A as the non-ohmic element is substantially the same as the method described in the first embodiment, and is only different in that one semiconductor layer constituting the non-ohmic element is a p-type layer or an n-type layer. Thus, the method of manufacturing the resistance change memory according to the second embodiment is not described.

Furthermore, the thickness of the depletion layer is adjusted by an impurity concentration of the n-type layer 43 included in the nim diode 40A is lower within about $10^{19}/cm^3$ to $10^{22}/cm^3$. As a result, when the thickness (height) of the diode is more reduced, the reverse current (on-current) in FIG. 11 can be kept.

As described above, according to the resistance change memory in the second embodiment, the characteristics of the non-ohmic element required for the resistance change memory are satisfied, and the thickness of the non-ohmic element can be reduced, as in the resistance change memory described in the first embodiment.

(2) Example

An example of the resistance change memory according to the second embodiment is described with FIG. 22 to FIG. 27.

FIG. 22 to FIG. 27 are diagrams showing the sectional structure of the cell unit used in the resistance change memory in the example according to the present embodiment.

Figure 22:
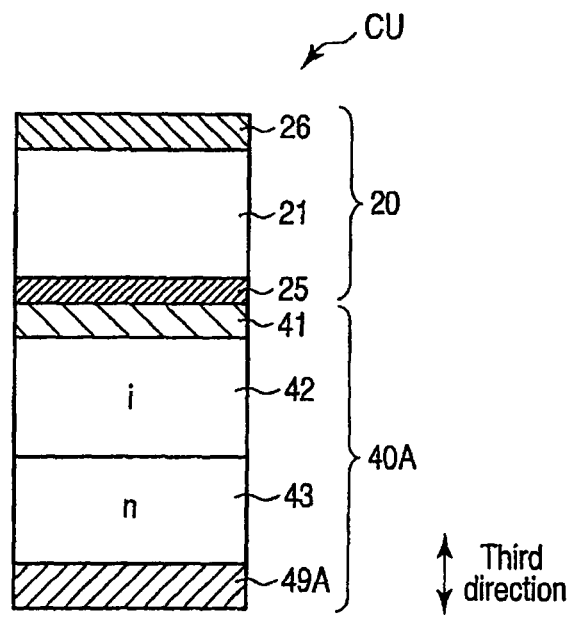
FIG. 22 is a diagram showing an example of the cell unit.

As shown in FIG. 22, the components (films) constituting the nim diode 40A may be stacked in reverse order from the order shown in FIG. 20 and FIG. 21.

As shown in FIG. 22, the n-type layer 43 is provided on the conductive layer 49A. The i-type layer 42 is provided on the n-type layer 43. The metal layer 41 is provided on the i-type layer 42. The conductive layer 49A is provided on a interconnect line.

Figure 23:
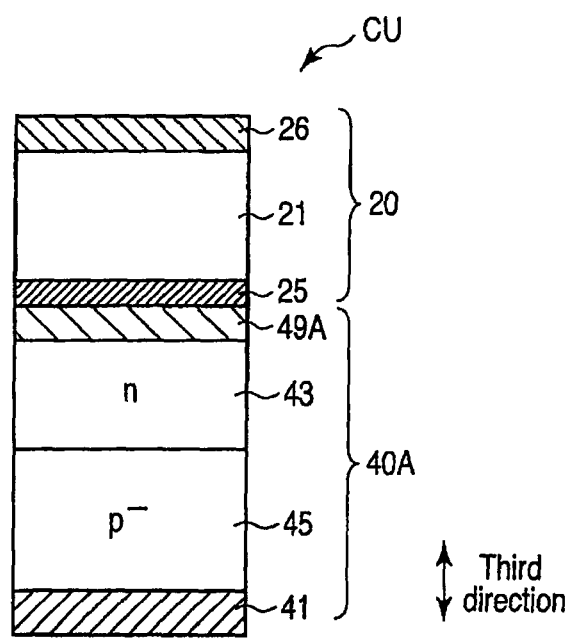
FIG. 23 is a diagram showing the example of the cell unit.

As shown in FIG. 23, a p-type semiconductor layer 45 low in impurity concentration may be used instead of the i-type layer. The p-type semiconductor layer 45 is referred to as a low-concentration p-type layer. When the n-type layer is an Si layer, the low-concentration p-type layer 45 is an Si layer to which boron (B) is added as an impurity (acceptor). The acceptor impurity concentration of the low-concentration p-type layer 45 is, for example, about $1 \times 10^{17}/cm^3$ to $1 \times 10^{19}/cm^3$.

In addition, the low-concentration p-type layer 45 may be a semiconductor layer such as a SiGe layer containing Si as the main component or a compound semiconductor layer as long as the low-concentration p-type layer 45 is a p-type semiconductor layer. However, the n-type layer 43 and the low-concentration p-type layer 45 are preferably semiconductor layers containing the same material as the main component.

As shown in FIG. 24, an n-type semiconductor layer 45 lower in impurity concentration than the n-type layer 43 may be used instead of the i-type layer or the low-concentration p-type layer. Here, the n-type semiconductor layer 45 low in impurity concentration is referred to as a low-concentration n-type layer 45.

The low-concentration n-type layer 43b is provided between the n-type layer 43 and the metal layer 41. The donor impurity concentration of the low-concentration n-type layer 45 is, for example, about $1 \times 10^{17}/cm^3$ to $1 \times 10^{19}/cm^3$.

In addition, the low-concentration n-type layer 43b may be a semiconductor layer such as an SiGe layer containing Si as the main component or a compound semiconductor layer as long as the low-concentration n-type layer 45 is an n-type semiconductor layer. However, the n-type layer 43 and the low-concentration n-type layer 45 preferably contain the same material as the main component.

As shown in FIG. 25, an i-type layer (or low-concentration p-type layer) 48 may have an unevenly distributed layer 48b in which an impurity contained therein is segregated with high concentration. The unevenly distributed layer 48b is in contact with the metal layer 41.

For example, the unevenly distributed layer 48b is a layer in which an impurity (e.g., B, P or As) is segregated with high concentration in the vicinity of the interface between an i-type layer 48a and the metal layer 41. The segregated impurity may be an impurity serving as a donor for the i-type layer or an impurity serving as an acceptor for the i-type layer. The thickness of the unevenly distributed layer 48b is, for example, about 1 nm.

Thus, the unevenly distributed layer 48b is formed at the interface between the metal layer 41 and the semiconductor layer (n-type layer or i-type layer) 48, such that the Schottky barrier $\phi_B$ between the metal layer 41 and the semiconductor layer 48 can be reduced. In addition, it is preferable that the unevenly distributed layer 48b be provided so that the Schottky barrier height between the metal layer 41 and the i-type layer 48 may be effectively closer to 0 eV.

Thus, the inhibition of the movement of the electrons injected to the semiconductor layer (e.g., the i-type layer) from the metal layer due to the Schottky barrier $\phi_B$ when a forward bias is applied to the nim diode 40A is reduced.

Therefore, the unevenly distributed layer 48b is provided at the interface between the low-concentration p-type layer (or i-type layer) 48 and the metal layer 41, such that the forward current in the nim diode 40A can be increased when a forward bias is applied.

A low-concentration n-type layer having an unevenly distributed layer in which a donor impurity is segregated may be used for the semiconductor layer between the n-type layer 43 and the conductive layer 49A.

In addition, as shown in FIG. 26, the components of the nim diode 40A may be stacked in the following order from the lower side (substrate side): the conductive layer 49A, the n-type layer 43, the low-concentration p-type layer (or i-type layer) 48 and the metal layer 41. When the unevenly distributed layer 48b is provided in the low-concentration p-type layer 48, the unevenly distributed layer 48b is formed in the upper part of the low-concentration region 48a and is in contact with the upper metal layer 41 of the nim diode 40A.

Furthermore, as shown in FIG. 27, a silicide layer 46 may be provided between the n-type layer 43 and the conductive layer 49A. In this case, a metal compound such as TiN is used for the conductive layer 49A. The silicide layer 46 is provided between the n-type layer 43 and the conductive layer 49A made of the metal compound, so that resistance (interface resistance) generated at the interface between the n-type layer 43 and the conductive layer 49A can be reduced. However, it goes without saying that the conductive layer 49A may be a silicide layer in the nim diode 40A shown in FIG. 20 to FIG. 26.

It is obvious that the memory element 20 and the nim diode 40A may be stacked in reverse order in each of the cell units shown in FIG. 21 and FIG. 27.

Here, the material used for the metal layer 41 that constitutes the nim diode 40A is described with FIG. 18.

In the nim diode used in the resistance change memory according to the present embodiment, the metal layer 41 is used as an anode layer and is a layer for injecting holes into the intrinsic or impurity-containing semiconductor layer.

Therefore, the metal layer 41 used in the nim diode 40A is preferably a conductor highly capable of injecting holes into the semiconductor layer, and the material used for the metal layer 41 preferably, has a high work function. That is, the Fermi level of the metal layer 41 is preferably located in the vicinity of the valence band side of the semiconductor layer and equal to or less than the Fermi level of the p-type semiconductor layer (e.g., p-type Si).

For example, when n-type Si is used in the n-type layer of the nim diode 40A, a material having a work function of about 4.6 eV to 5.3 eV is preferably used for the metal layer. A material selected from the group consisting of the following materials is used for the metal layer 41 of the nim diode 40A: silicide such as $TiSi_x$, $PtSi_x$, $PdSi_x$, $WSi_x$ and $IrSi_x$, a conductive compound such as $TiN_x$, $TiC_x$, $HfN_x$, $LaB_x$, $WB_x$, $WN_x$, $WC_x$ and $RuO_x$, and a pure metal such as W, Pd, Pt, Ir and Ru (here, x>0).

However, it goes without saying that a conductor other than the materials taken here as examples may be used for the metal layer that constitutes the nim diode.

Thus, the height of the Schottky barrier created between the semiconductor layer (e.g., the i-type layer 42) and the metal layer 41 can be smaller. As a result, when a forward bias is applied to the nim diode 40A used in the resistance change memory according to the present embodiment, the inhibition of the movement of the electrons injected to the i-type layer 42 from the metal layer 41 due to the Schottky barrier between the metal layer 41 and the semiconductor layer 42 is reduced.

Therefore, if a conductor having a high work function is used as the material for the metal layer, the output current of the nim diode 40A when a forward bias is applied can be increased.

In addition, the thickness of each layer used in the nim diode 40A according to the present embodiment and the impurity concentration of the semiconductor layer can be properly changed depending on the characteristics required for the non-ohmic element of the resistance change memory.

Moreover, similarly to the pim diode described above, during reverse bias application, the nim diode 40A according to the present embodiment outputs a low reverse current between 0 V and the value of the on-voltage, and outputs a high reverse current (on-current) as a result of a tunneling phenomenon when the voltage is equal to or more than the on-voltage. Thus, the nim diode 40A according to the present embodiment is also applicable to the resistance change memory that uses the memory element for the unipolar operation and the bipolar operation.

<3> Material Examples

Examples of materials used for the cell unit in the resistance change memory according to the present embodiment are described below.

The resistance change memory in the embodiments has been described above mainly illustrating silicon as the semiconductor layer that constitutes the non-ohmic element. However, materials other than the material containing silicon as the main component may be used for the semiconductor layer as a constituent part of the cell unit as long as such materials are semiconducting materials. That is, instead of silicon and silicon germanium, a substance can be selected from the group consisting of C, GaAs, a semiconductor oxide, a semiconductor nitride, a semiconductor carbide and a semiconductor sulfide.

The p-type semiconductor layer is preferably made of one or a combination of substances selected from the group consisting of p-type Si, $TiO_2$, $ZrO_2$, $InZnO_x$, ITO, $SnO_2$ containing Sb, p-type ZnO, ZnO containing Al, $AgSbO_3$, $InGaZnO_4$ and $ZnO$—$SnO_2$.

The n-type semiconductor layer is preferably made of one or a combination of substances selected from the group consisting of n-type Si, $NiO_x$, ZnO, $Rh_2O_3$, ZnO containing N, ZnO containing In and $La_2CuO_4$.

An insulator (insulating layer) may be contained in the cell unit including the pim or nim diode. The insulating layer contained in the cell unit is selected from, for example, the following materials.

a) Oxides $SiO_2$, $Al_2O_3$, $Y_2O_3$, $La_2O_3$, $Gb_2O_3$, $Ce_2O_3$, $CeO_2$, $Ta_2O_5$, $HfO_2$, $ZrO_2$, $TiO_2$, HfSiO, HfAlO, ZrSiO, ZrAlO, AlSiO $AB_2O_4$ Here, A and B are the same element or different elements, and are one or a combination of substances selected from the group consisting of Al, Sc, Ti, V, Cr, Mn, Fe, Co, Ni, Cu, Zn, Ga and Ge.

For example, $Fe_3O_4$, $FeAl_2O_4$, $Mn_{1+x}Al_{2-x}O_{4+y}$, $Co_{1+x}Al_{2-x}O_{4+y}$, or $MnO_x$.

$ABO_3$

Here, A and B are the same element or different elements, and are one or a combination of substances selected from the group consisting of Al, La, Hf, Ta, W, Re, Os, Ir, Pt, Au, Hg, Tl, Pb, Bi, Ce, Pr, Nd, Pm, Sm, Eu, Gd, Tb, Dy, Ho, Er, Tm, Yb, Lu, Sc, Ti, V, Cr, Mn, Fe, Co, Ni, Cu, Zn, Ga, Ge, Y, Zr, Nb, Mo, Tc, Ru, Rh, Pd, Ag, Cd, In and Sn.

For example, $LaAlO_3$, $SrHfO_3$, $SrZrO_3$ or $SrTiO_3$.

b) Oxynitrides

SiON, AlON, YON, LaON, GdON, CeON, TaON, HfON, ZrON, TiON, LaAlON, SrHfON, SrZrON, SrTiON, HfSiON, HfAlON, ZrSiON, ZrAlON, AlSiON

Substances in which part of the oxygen element of the above-mentioned oxides of a) is substituted for a nitrogen element The Si-based insulating films made of, for example, $SiO_2$, SiN or SiON includes insulating films in which the concentration of both the oxygen element and nitrogen element is $1 \times 10^{18}/cm^3$ or more.

A conductive interconnect line functioning as a word line/bit line is made of one or a combination of substances selected from the group consisting of W, WN, Al, Ti, V, Cr, Mn, Fe, Co, Ni, Cu, TiN, $WSi_x$, $TaSi_x$, $PdSi_x$, $ErSi_x$, $YSi_x$, $PtSi_x$, $HfSi_x$, $NiSi_x$, $CoSi_x$, $TiSi_x$, $VSi_x$, $XrSi_x$, $MnSi_x$ and $FeSi_x$ (here, x>0). When the conductive interconnect line is formed of a plurality of substances, a constituent part of the conductive interconnect line may be made up of mixed crystal layers of a plurality of substances.

The electrode layer and the conductive layer of the pim/nim diode or memory element include, for example, a single metal element or a plurality of mixtures, a silicide or oxide, and a nitride. Specifically, the electrode layer and the conductive layer are made of one or a combination of substances selected from the group consisting of Pt, Au, Ag, Ru, Ir, Ti, V, Cr, Mn, Fe, Co, Ni, Cu, Al, Rh, RuN, TiN, TaN, TiAlN, TaAlN, $SrRuO_x$, $LaNiO_x$, $PtIrO_x$, $PtRhO_x$, $SiTiO_x$, $WSi_x$, $TaSi_x$, $PdSi_x$, $PtSi_x$, $IrSi_x$, $ErSi_x$, $YSi_x$, $HfSi_x$, $NiSi_x$, $CoSi_x$, $TiSi_x$, $VSi_x$, $CrSi_x$, $MnSi_x$ and $FeSi_x$ (here, x>0). When the electrode layer and the conductive layer are formed by using a plurality of substances, constituent parts of the electrode layer and the conductive layer may be made up of mixed crystal layers of a plurality of substances.

If one or a combination of two or more substances selected from the group consisting of $TiSi_x$, $VSi_x$, $CrSi_x$, $MnSi_x$, $FeSi_x$, $CoSi_x$, $NiSi_x$, $NdSi_x$, $MoSi_x$, $HfSi_x$, $TaSi_x$, $WSi_x$, $PdSi_x$, $IrSi_x$, $PtSi_x$, $RhSi_x$, $ReSi_x$ and $OsSi_x$ (here, x>0) is used as a silicide for the p-type silicon layer (p-type layer), the interface resistance between the P-type silicon layer and the silicide layer can be reduced. When two or more silicides are used to form the electrode layer (conductive layer) for the p-type silicon layer (p layer), the electrode layer may be made up of mixed crystal layers of two or more silicides.

If one or a combination of two or more substances selected from the group consisting of $TiSi_x$, $VSi_x$, $CrSi_x$, $MnSi_x$, $FeSi_x$, $CoSi_x$, $NiSi_x$, $NdSi_x$, $MoSi_x$, $HfSi_x$, $TaSi_x$, $YSi_x$, $YbSi_x$, $ErSi_x$, $HoSi_x$, $DySi_x$, $GdSi_x$ and $TbSi_x$ (here, x>0) is used as a silicide for the n-type silicon layer (n-type layer), the interface resistance between the n-type silicon layer and the silicide layer can be reduced. When two or more silicides are used to form the electrode layer (conductive layer) for the n-type silicon layer (n-type layer), the electrode layer may be made up of mixed crystal layers of two or more silicides.

The electrode layer (conductive layer) may have a function of the diffusion preventing layer or the adhesive layer.

Instead of the materials shown in FIG. 18, the metal layer to constitute the pim diode (or nim diode) may be made of one or a combination of substances selected from the group consisting of a). a single element or a mixture of a plurality of metal elements, b). a compound metal as an oxide, carbide, boride, nitride, or silicide, and c). $TiN_x$, $TiC_x$, $TiB_x$, $TiSi_x$, $TaC_x$, $TaB_x$, $TaN_x$, $WC_x$, $WB_x$, W, $WSi_x$, $TaSi_x$, $LaB_x$, $LaN_x$, $LsSi_x$, $HfSi_x$, Hf, $YSi_x$, $ErSi_x$, $NiSi_x$, $PtSi_x$, $PdSi_x$, $CoSi_x$, $MnSi_x$, $CrSi_x$ and $FeSi_x$ (here, x>0).

<4> Application

The resistance change memory of the present embodiments are highly promising as a next-generation universal memory which replaces memories used in devices currently manufactured as products, such as a magnetic memory, a NAND flash memory and dynamic random access memory.

Thus, the present embodiments are applicable to, for example, a file memory capable of high-speed random writing, a portable terminal capable of high-speed downloading, a portable player capable of high-speed downloading, a semiconductor memory for broadcasting equipment, a drive recorder, a home video, a high-capacity buffer memory for communication and a semiconductor memory for a security camera.

<5> Conclusion

According to the present embodiments, the characteristics of the non-ohmic element for the resistance change memory are improved, and the thickness of the non-ohmic element can be sufficiently reduced.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A resistance change memory comprising:
a first interconnect line extending in a first direction;
a second interconnect line extending in a second direction intersecting with the first direction; and
a cell unit which is provided at the intersection of the first interconnect line and the second interconnect line and which includes a memory element and a non-ohmic element that are connected in series, the memory element storing data in accordance with a change in a resistance state,
the non-ohmic element including a metal layer, a first semiconductor layer containing a first impurity, and a second semiconductor layer including an unevenly distributed layer in one end of the second semiconductor layer, the unevenly distributed layer being in direct contact with the metal layer, and the first semiconductor layer being in contact with the other end of the second semiconductor layer,
an impurity concentration of the unevenly distributed layer is $1\times10^{17}/cm^3$ or more and $1\times10^{20}/cm^3$ or less, and
a height of the unevenly distributed layer is less than 10 nm and not less than 0.5 nm.

2. The resistance change memory according to claim 1, wherein the unevenly distributed layer contains a second impurity of an inverse conductivity type to that of the first impurity.

3. The resistance change memory according to claim 1, wherein the non-ohmic element includes a silicide layer provided on a side of the first semiconductor layer opposite to a side in contact with the second semiconductor layer.

4. The resistance change memory according to claim 1, wherein the non-ohmic element includes a conductive layer provided on a side of the first semiconductor layer opposite to a side in contact with the second semiconductor layer, and a silicide layer provided between the first semiconductor layer and the conductive layer.

5. The resistance change memory according to claim 1, wherein the first semiconductor layer is a p-type semiconductor layer.

6. The resistance change memory according to claim 5, wherein the metal layer is made of a conductor having a work function of 3.5 eV or more and 4.7 eV or less.

7. The resistance change memory according to claim 5, wherein the metal layer is made of one kind selected from the group consisting of $TiC_x$, $TiB_x$, $TiN_x$, $TiSi_x$, $TaC_x$, $TaB_x$, $TaN_x$, $WSi_x$, $TaSi_x$, La, $LaB_x$, LaN, $CoSi_x$, $NiSi_x$, $HfSi_x$, $HfSiN_x$, Hf, $YSi_x$, $ErSi_x$, and ZrC (here, x>0).

8. The resistance change memory according to claim 5, wherein the first semiconductor layer is an anode layer, and the metal layer is a cathode layer.

9. The resistance change memory according to claim 1, wherein the first semiconductor layer is an n-type semiconductor layer.

10. The resistance change memory according to claim 9, wherein the metal layer is made of a conductor having a work function of 4.6 eV or more and 5.3 eV or less.

11. The resistance change memory according to claim 9, wherein the metal layer is made of one kind selected from the group consisting of Pt, $PtSi_x$, Pd, $PdSi_x$, Ir, $IrSi_x$, $LaB_x$, $WB_x$, Ru, $RuO_x$, $HfN_x$, $TiN_x$, TiC, $TiSi_x$, $WN_x$, $WC_x$, $WB_x$, $WSi_x$ and W (here, x>0).

12. The resistance change memory according to claim 1, wherein
a region of the second semiconductor layer other than the unevenly distributed layer is a semiconductor layer to which no impurity is added or a semiconductor layer containing a small amount of impurity that is negligible to intrinsic carrier density.

13. The resistance change memory according to claim 1, wherein the second semiconductor layer is a p-type semiconductor layer, and the impurity concentration of the second semiconductor layer is $10^{17}/cm^3$ or more and $10^{19}/cm^3$ or less.

14. The resistance change memory according to claim 1, wherein the second semiconductor layer is provided on the metal layer, and the first semiconductor layer is provided on the second semiconductor layer.

15. The resistance change memory according to claim 1, wherein the second semiconductor layer is provided on the first semiconductor layer, and the metal layer is provided on the second semiconductor layer.

16. The resistance change memory according to claim 1, wherein the non-ohmic element bidirectionally supplies the memory element with a current which changes the resistance state of the memory element.

* * * * *